(12) United States Patent
Huang

(10) Patent No.: US 11,662,762 B2
(45) Date of Patent: May 30, 2023

(54) CLOCK DUTY CYCLE ADJUSTMENT AND CALIBRATION CIRCUIT AND METHOD OF OPERATING SAME

(71) Applicant: TAIWAN SEMICONDUCTOR MANUFACTURING COMPANY, LTD., Hsinchu (TW)

(72) Inventor: Tien-Chien Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/702,587

(22) Filed: Mar. 23, 2022

(65) Prior Publication Data
US 2022/0214711 A1 Jul. 7, 2022

Related U.S. Application Data

(63) Continuation of application No. 17/142,481, filed on Jan. 6, 2021, now Pat. No. 11,294,419, which is a
(Continued)

(51) Int. Cl.
*H03K 3/017* (2006.01)
*G06F 1/08* (2006.01)
(Continued)

(52) U.S. Cl.
CPC ............. *G06F 1/08* (2013.01); *H03C 3/0966* (2013.01); *H03C 3/0991* (2013.01); *H03K 3/017* (2013.01); *H03K 5/1565* (2013.01); *H03L 7/07* (2013.01)

(58) Field of Classification Search
CPC ........ G06F 1/08; H03K 5/1565; H03K 5/017; H03K 5/0315; H03K 5/0231; H03K 5/135; H03L 7/07
See application file for complete search history.

(56) References Cited

U.S. PATENT DOCUMENTS 7,612,592 B2 * 11/2009 Parikh .................... H03K 5/156
327/175
8,143,928 B2 * 3/2012 Satoh .................... H03L 7/0805
327/158
(Continued)

FOREIGN PATENT DOCUMENTS

| JP | 2000357947 A | 12/2000 |
|----|--------------|---------|
| JP | 2002190733 A | 7/2002 |
| JP | 2009290857 A | 12/2009 |

OTHER PUBLICATIONS

Notice of Allowance dated Nov. 16, 20202 for corresponding application No. KR 10-2019-010977. (pp. 1-6).

*Primary Examiner* — Sibin Chen
(74) *Attorney, Agent, or Firm* — Hauptman Ham, LLP

(57) ABSTRACT

A clock circuit includes a set of level shifters, a duty cycle adjustment circuit and a calibration circuit. The set of level shifters is configured to output a first set of phase clock signals having a first duty cycle. Each level shifter is configured to output a corresponding phase clock signal of the first set of phase clock signals. The duty cycle adjustment circuit is configured to generate a first clock output signal responsive to at least one of a first or second phase clock signal of the first set of phase clock signals or a set of control signals. The first clock output signal has a second duty cycle. The calibration circuit is configured to perform a duty cycle calibration of the second duty cycle based on an input duty cycle, and generate the set of control signals responsive to the duty cycle calibration of the second duty cycle.

20 Claims, 12 Drawing Sheets

Related U.S. Application Data continuation of application No. 16/539,228, filed on Aug. 13, 2019, now Pat. No. 10,890,938.

(60) Provisional application No. 62/720,039, filed on Aug. 20, 2018.

(51) Int. Cl.
*H03C 3/09* (2006.01)
*H03K 5/156* (2006.01)
*H03L 7/07* (2006.01)

(56) References Cited

U.S. PATENT DOCUMENTS

| | | | |
|---|---|---|---|
| 8,736,329 B1* | 5/2014 | Rajavi | H03K 5/1565 327/175 |
| 2011/0291724 A1 | 12/2011 | Jain et al. | |
| 2013/0094321 A1* | 4/2013 | Shido | G11C 11/4076 365/230.06 |
| 2019/0198075 A1* | 6/2019 | Lee | G11C 29/023 |

* cited by examiner

CLOCK DUTY CYCLE ADJUSTMENT AND CALIBRATION CIRCUIT AND METHOD OF OPERATING SAME

PRIORITY CLAIM

This application is a continuation of U.S. application Ser. No. 17/142,481, filed Jan. 6, 2021, now U.S. Pat. No. 11,294,419, issued Apr. 5, 2022, which is a continuation of U.S. application Ser. No. 16/539,228, filed Aug. 13, 2019, now U.S. Pat. No. 10,890,938, issued Jan. 12, 2021, which claims the benefit of U.S. Provisional Application No. 62/720,039, filed Aug. 20, 2018, which are herein incorporated by reference in their entireties.

BACKGROUND

The semiconductor integrated circuit (IC) industry has produced a wide variety of digital devices to address issues in a number of different areas. Some of these digital devices, such as level shifter circuits, are configured to enable operation of circuits capable of operation in different voltage domains. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
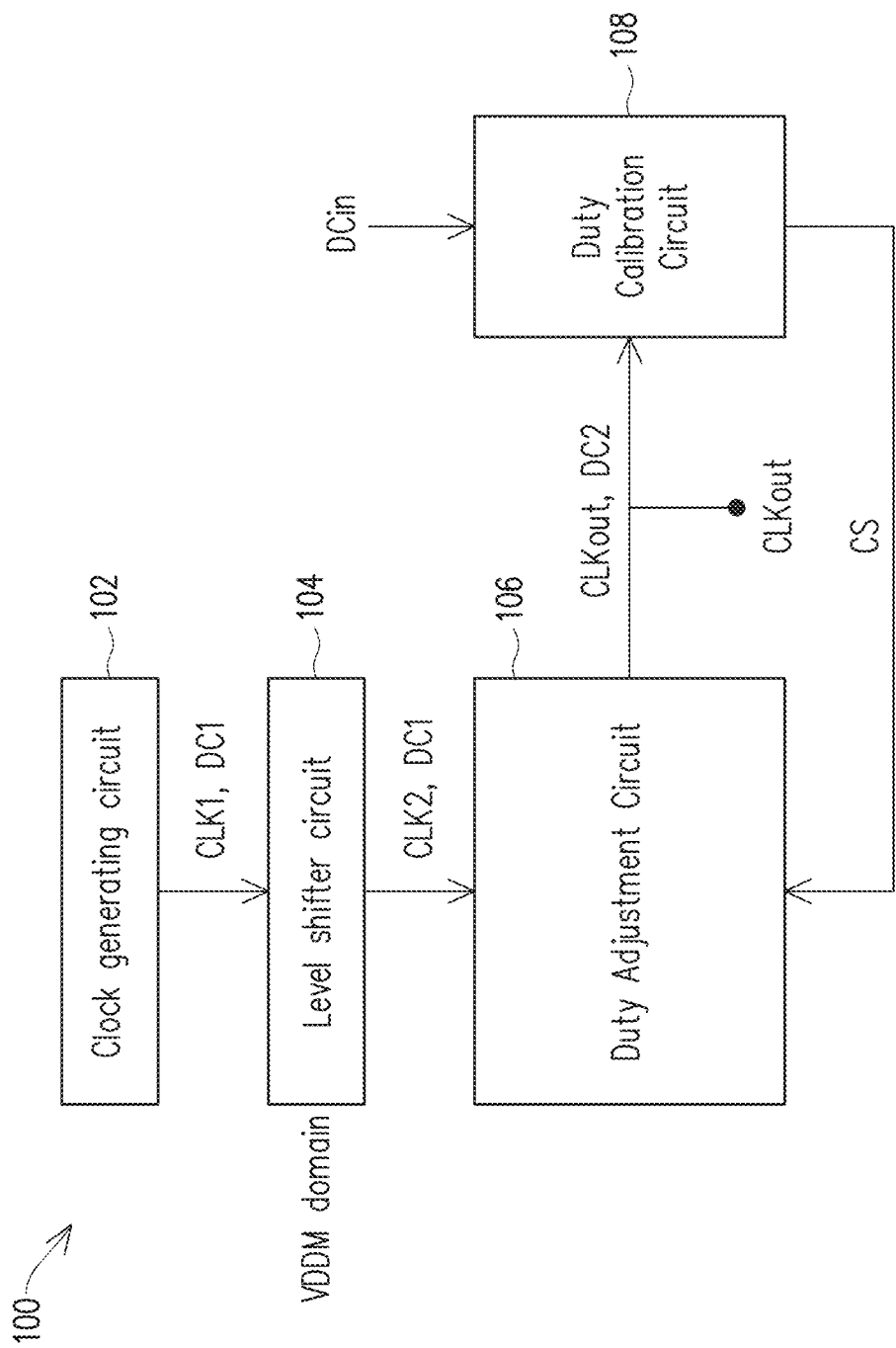
FIG. 1 is a block diagram of a circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a clock duty cycle adjustment and calibration circuit includes a ring oscillator, a set of level shifters, a duty cycle adjustment circuit and a duty cycle calibration circuit.

In some embodiments, the ring oscillator includes a set of stages. In some embodiments, the ring oscillator is configured to generate a first set of phase clock signals having a first duty cycle.

In some embodiments, the set of level shifters is coupled to the ring oscillator, and is configured to output a second set of phase clock signals. In some embodiments, each level shifter is configured to output a corresponding phase clock signal of the second set of phase clock signals based on a corresponding phase clock signal of the first set of phase clock signals.

In some embodiments, the duty cycle adjustment circuit is coupled to the set of level shifters, and is configured to generate a first clock output signal responsive to a first phase clock signal of the second set of phase clock signals and a second phase clock signal of the second set of phase clock signals. In some embodiments, the first clock output signal has a duty cycle. In some embodiments, the duty cycle adjustment circuit is further configured to tune or adjust the first clock output signal and the duty cycle responsive to at least a set of control signals.

In some embodiments, the duty cycle calibration circuit is coupled to the duty cycle adjustment circuit, and is configured to perform a calibration of the duty cycle of the first clock output signal based on an input duty cycle. In some embodiments, the duty cycle calibration circuit is configured to generate the set of control signals responsive to the calibration of the duty cycle of the first clock output signal. In some embodiments, the duty cycle calibration circuit includes a reference generator circuit that is programmable based on the input duty cycle signal. In some embodiments, the reference generator circuit is configured to generate a reference duty cycle signal in response to the input duty cycle. In some embodiments, the duty cycle calibration circuit adjusts the duty cycle of the first clock output signal based on the reference duty cycle signal.

In some embodiments, by using the set of control signals, duty cycle calibration circuit is configured to calibrate the duty cycle adjustment circuit automatically and does not utilize analog voltage measurement on a chip level.

In some embodiments, the duty cycle of the clock output signal is independent of the duty cycle of each of the first phase clock signal, the adjusted first phase clock signal and the second phase clock signal. In some embodiments, by being independent of the duty cycle of the first phase clock signal, the adjusted first phase clock signal and the second phase clock signal, the clock duty cycle adjustment and calibration circuit is more robust to corrupted input waveforms compared to other approaches.

In some embodiments, by being independent of the duty cycle of the first phase clock signal, the adjusted first phase clock signal and the second phase clock signal, the clock duty cycle adjustment and calibration circuit is configured to output a clock output signal with a same frequency as the first set of phase clock signals without the use of frequency dividers that occupy more area and add extra complexity.

In some embodiments, duty cycle calibration circuit includes filters utilized with signals having higher frequencies, and the filters therefore occupy less area than filters utilized with signals having lower frequencies.

Circuit

FIG. 1 is a block diagram of a circuit 100, in accordance with some embodiments. In some embodiments, circuit 100 is a clock duty cycle adjustment and calibration circuit.

Circuit 100 comprises a clock generating circuit 102, a set of level shifter circuits 104, a duty cycle adjustment circuit 106 and a duty cycle calibration circuit 108.

The clock generating circuit 102 is coupled to the set of level shifter circuits 104. The clock generating circuit 102 is configured to generate a first set of phase clock signals CLK1 having a duty cycle DCL. In some embodiments, each clock signal of the first set of phase clock signals CLK1 is offset from an adjacent clock signal of the first set of phase clock signals CLK1 by a phase difference $\Delta\varphi 1$. In some embodiments, the clock generating circuit 102 comprises a ring oscillator.

In some embodiments, clock generating circuit 102 is coupled to a first voltage supply node (not shown) having a first supply voltage VDDI (FIG. 5), and is therefore referred to as being in a VDDI voltage domain. In some embodiments, first supply voltage VDDI has a first voltage swing. In some embodiments, one or more of the first set of phase clock signals CLK1 has the first voltage swing.

The set of level shifter circuits 104 is coupled to the clock generating circuit 102, and is configured to output a second set of phase clock signals CLK2. In some embodiments, the second set of phase clock signal CLK2 has the duty cycle DC1. The set of level shifter circuits 104 is configured to receive the first set of phase clock signals CLK1. In some embodiments, the set of level shifter circuits 104 is configured to generate the second set of phase clock signals CLK2 responsive to the first set of phase clock signals CLK1. In some embodiments, each clock signal of the second set of phase clock signals CLK2 is offset from an adjacent clock signal of the second set of phase clock signals CLK2 by a phase difference $\Delta\varphi 2$. In some embodiments, phase difference $\Delta\varphi 1$ is equal to phase difference $\Delta\varphi 2$. In some embodiments phase difference $\Delta\varphi 1$ is different from phase difference $\Delta\varphi 2$.

In some embodiments, the set of level shifter circuits 104 is coupled to a second voltage supply node (not shown) having a second supply voltage VDDM (FIG. 5), and is therefore referred to as being in a VDDM voltage domain. In some embodiments, second supply voltage VDDM is different from first supply voltage VDDI. In some embodiments, second supply voltage VDDM has a second voltage swing different from the first voltage swing. In some embodiments, VDDM voltage domain is different from VDDI voltage domain.

The set of level shifter circuits 104 includes one or more level shifter circuits configured to shift at least one signal of the first set of phase clock signals CLK1 from the VDDI voltage domain that uses a supply voltage VDDI to the VDDM voltage domain that uses a supply voltage VDDM. In some embodiments, one or more of the second set of phase clock signals CLK1 is referred to as level shifted clock signals. In some embodiments, one or more of the second set of phase clock signals CLK1 has the second voltage swing.

The duty cycle adjustment circuit 106 is coupled to the set of level shifter circuits 104 and the duty calibration circuit 108. The duty cycle adjustment circuit 106 is configured to receive the second set of phase clock signals CLK2 and generate a first clock output signal CLKout responsive at least the second set of phase clock signals CLK2 or the a set of control signals CS. In some embodiments, the first clock output signal has a duty cycle DC2. In some embodiments, the duty cycle DC2 is different from duty cycle DC1. In some embodiments, the duty cycle DC2 is the same as the duty cycle DC1. In some embodiments, the first clock output signal CLKout is an output signal of circuit 100.

In some embodiments, the duty cycle adjustment circuit 106 is configured to adjust the duty cycle DC2 of the first clock output signal CLKout responsive to at least the set of control signals CS.

In some embodiments, the duty cycle adjustment circuit 106 is configured to adjust the first clock output signal CLKout and the duty cycle DC2 responsive to at least the set of control signals CS or the second set of phase clock signals CLK2.

The duty cycle calibration circuit 108 is configured to receive an input duty cycle DCin, the first clock output signal CLKout and the corresponding duty cycle DC2. The duty cycle calibration circuit 108 is coupled to the duty cycle adjustment circuit 106, and configured to perform a duty cycle calibration of the duty cycle DC2 of the first clock output signal CLKout based on at least the input duty cycle DCin. In some embodiments, the input duty cycle DCin is received by a user. In some embodiments, the input duty cycle DCin is received by another circuit.

The duty cycle calibration circuit 108 is configured to generate the set of control signals CS responsive to the duty cycle calibration of the duty cycle DC2 of the first clock output signal CLKout. In some embodiments, the duty cycle calibration circuit 108 is configured to compare the duty cycle DC2 of the first clock output signal CLKout and the input duty cycle DCin, and to generate the set of control signals CS based on the comparison of the duty cycle DC2 of the first clock output signal CLKout and the input duty cycle DCin.

Figure 2A:
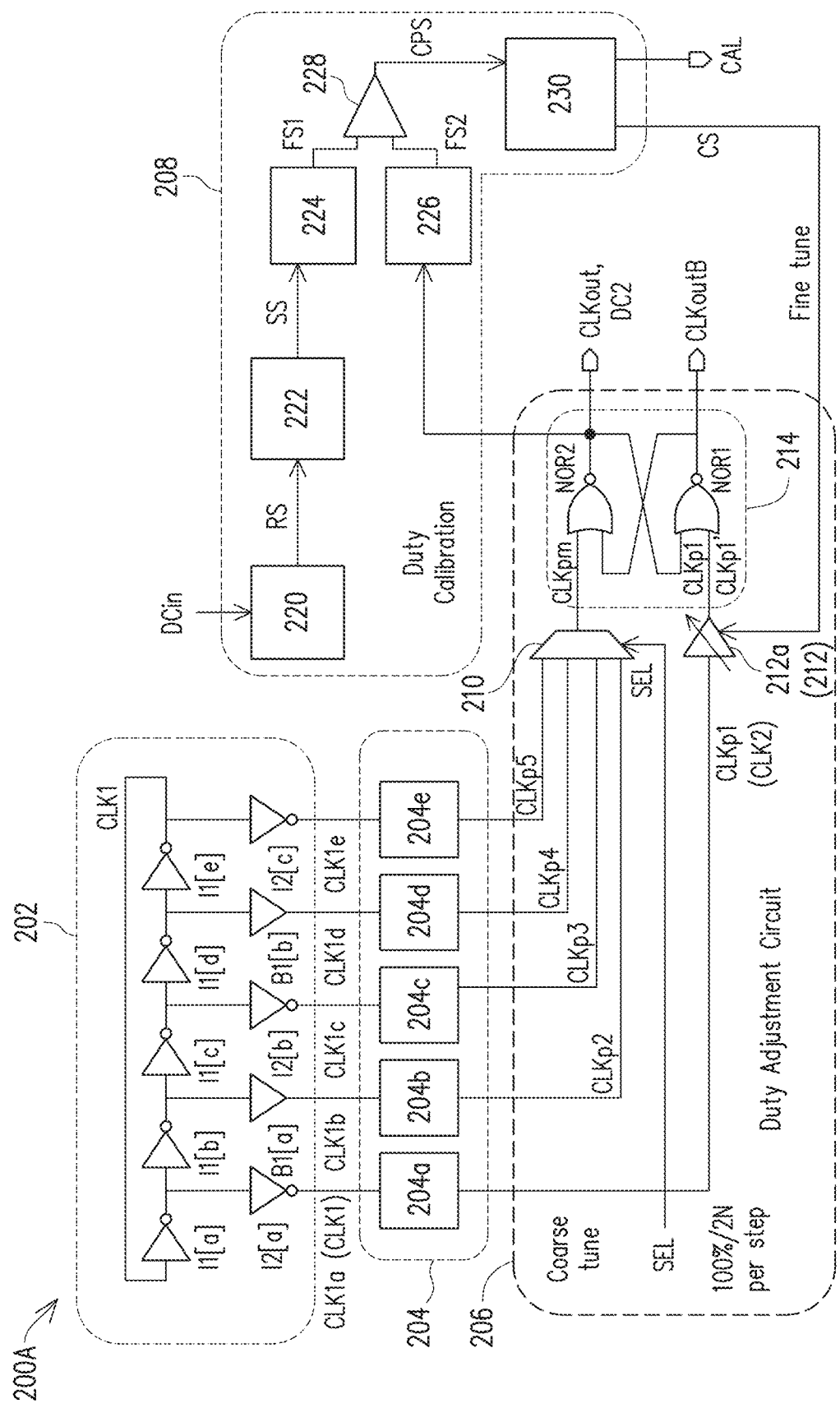
FIG. 2A is a circuit diagram of a circuit, in accordance with some embodiments.

FIG. 2A is a circuit diagram of a circuit 200A, in accordance with some embodiments.

Circuit 200A is an embodiment of circuit 100 of FIG. 1. In some embodiments, circuit 200A or circuit 200B (FIG. 2B) is a clock duty cycle adjustment and calibration circuit.

Circuit 200A comprises a ring oscillator 202, a set of level shifter circuits 204, a duty cycle adjustment circuit 206 and a duty cycle calibration circuit 208.

Ring oscillator 202 is an embodiment of clock generating circuit 102 of FIG. 1, and similar detailed description is omitted. Ring oscillator 202 is configured to generate the first set of phase clock signals CLK1. In some embodiments, the first set of phase clock signals CLK1 includes at least a phase clock signal CLK1a, CLK1b, CLK1c, CLK1d or CLK1e.

Ring oscillator 202 has N stages (collectively referred to as "a set of stages" (not labelled)), where N is an integer corresponding to the number of stages in ring oscillator 202. Each stage of the set of stages is configured to generate a corresponding phase clock signal CLK1a, CLK1b, CLK1c, CLK1d or CLK1e of the first set of phase clock signals CLK1. In some embodiments, the number of stages N of the set of stages (not labelled) is odd. In some embodiments, a number of phase clock signals of the first set of phase clock signals CLK1 is odd, and equal to integer N. Other numbers of stages N or phase clock signals of the first set of phase clock signals CLK1 are within the scope of the present disclosure.

Ring oscillator 202 comprises a first set of inverters I1, a second set of inverters I2 and a set of buffers B1.

The first set of inverters I1 includes at least inverter I1[a], I1[b], I1[c], I1[d] or I1[e] coupled together in a ring. An output terminal of inverter I1[a] is coupled to an input terminal of inverter I1[b]. An output terminal of inverter I1[b] is coupled to an input terminal of inverter I1[c]. An output terminal of inverter I1[c] is coupled to an input terminal of inverter I1[d]. An output terminal of inverter I1[d] is coupled to an input terminal of inverter I1[e]. An output terminal of inverter I1[e] on a first end (not labelled) is coupled to an input terminal of inverter I1[a] on an opposite end (not labelled) from the first end.

In some embodiments, each inverter of the first set of inverters I1 corresponds to a stage of the set of stages (not labelled). In some embodiments, a number of inverters of the first set of inverters I1 is odd.

The second set of inverters I2 at least inverter I2[a], I2[b] or I2[c]. An input terminal of inverter I2[a] is coupled to the input terminal of inverter I1[b] and the output terminal of inverter I1[a]. An input terminal of inverter I2[b] is coupled to the input terminal of inverter I1[d] and the output terminal of inverter I1[c]. An input terminal of inverter I2[c] is coupled to the input terminal of inverter I1[a] and the output terminal of inverter I1[e]. Inverter I2[a], I2[b], I2[c] is configured to generate corresponding phase clock signal CLK1a, CLK1c, CLK1e of the first set of phase clock signals CLK1.

An output terminal of corresponding inverter I2[a], I2[b], I2[c] is coupled to a corresponding input terminal of level shifters 20aa, 204c, 204e of the set of level shifters 204.

In some embodiments, each inverter of the second set of inverters I2 is coupled to a corresponding pair of inverters of the first set of inverters I1 and a corresponding level shifter of the set of level shifters 204.

The set of buffers B1 includes at least buffer B1[a] or B1[b]. An input terminal of buffer B1[a] is coupled to the output terminal of inverter I1[b] and the input terminal of inverter I1[c]. An input terminal of buffer B1[b] is coupled to the output terminal of inverter I1[d] and the input terminal of inverter I1[e]. In some embodiments, set of buffers B1 is configured to provide a delay to phase clock signals CLK1b and CLk1d of the first set of phase clock signals.

An output terminal of corresponding buffer B2[a], B2[b] is coupled to a corresponding input terminal of level shifters 204b, 204d of the set of level shifters 204.

In some embodiments, each buffer of the set of buffers B1 is coupled to another corresponding pair of inverters of the first set of inverters I1 and another corresponding level shifter of the set of level shifters 204.

The set of level shifter circuits 204 is an embodiment of the set of level shifter circuits 104 of FIG. 1, and similar detailed description is omitted. The set of level shifter circuits 204 is coupled to ring oscillator 202 and the duty cycle adjustment circuit 206.

The set of level shifter circuits 204 is configured to generate the second set of phase clock signals CLK2. In some embodiments, the second set of phase clock signals CLK2 includes at least a phase clock signal CLKp1, CLKp2, CLKp3, CLKp4 or CLKp5. In some embodiments, each level shifter is configured to generate or output a corresponding phase clock signal CLKp1, CLKp2, CLKp3, CLKp4, CLKp5 of the second set of phase clock signals CLK2 based on a corresponding phase clock signal CLK1a, CLK1b, CLK1c, CLK1d, CLK1e of the first set of phase clock signals CLK1. In some embodiments, each level shifter of the set of level shifters 204 is coupled to a corresponding stage of the set of stages (not labelled) of the ring oscillator 202.

The duty cycle adjustment circuit 206 is an embodiment of the duty cycle adjustment circuit 106 of FIG. 1, and similar detailed description is omitted.

The duty cycle adjustment circuit 206 is coupled to the set of level shifters 204 and the duty calibration circuit 208. In some embodiments, the duty cycle adjustment circuit 206 is configured to receive at least the second set of phase clock signals CLK2. In some embodiments, the duty cycle adjustment circuit 206 is configured to generate a first clock output signal CLKout responsive to a first phase clock signal (e.g., phase clock signal CLKp1) of the second set of phase clock signals and a second phase clock signal CLKpm of the second set of phase clock signals CLK2. In some embodiments, the second phase clock signal CLKpm of the second set of phase clock signals CLK2 includes phase clock signal CLKp2, CLKp3, CLKp4 or CLKp5.

The duty cycle adjustment circuit 206 is configured to generate a first phase clock output signal CLKout having a duty cycle DC2. In some embodiments, the duty cycle DC2 of the first phase clock output signal CLKout is determined according to formula 2 (as described below).

Figure 2B:
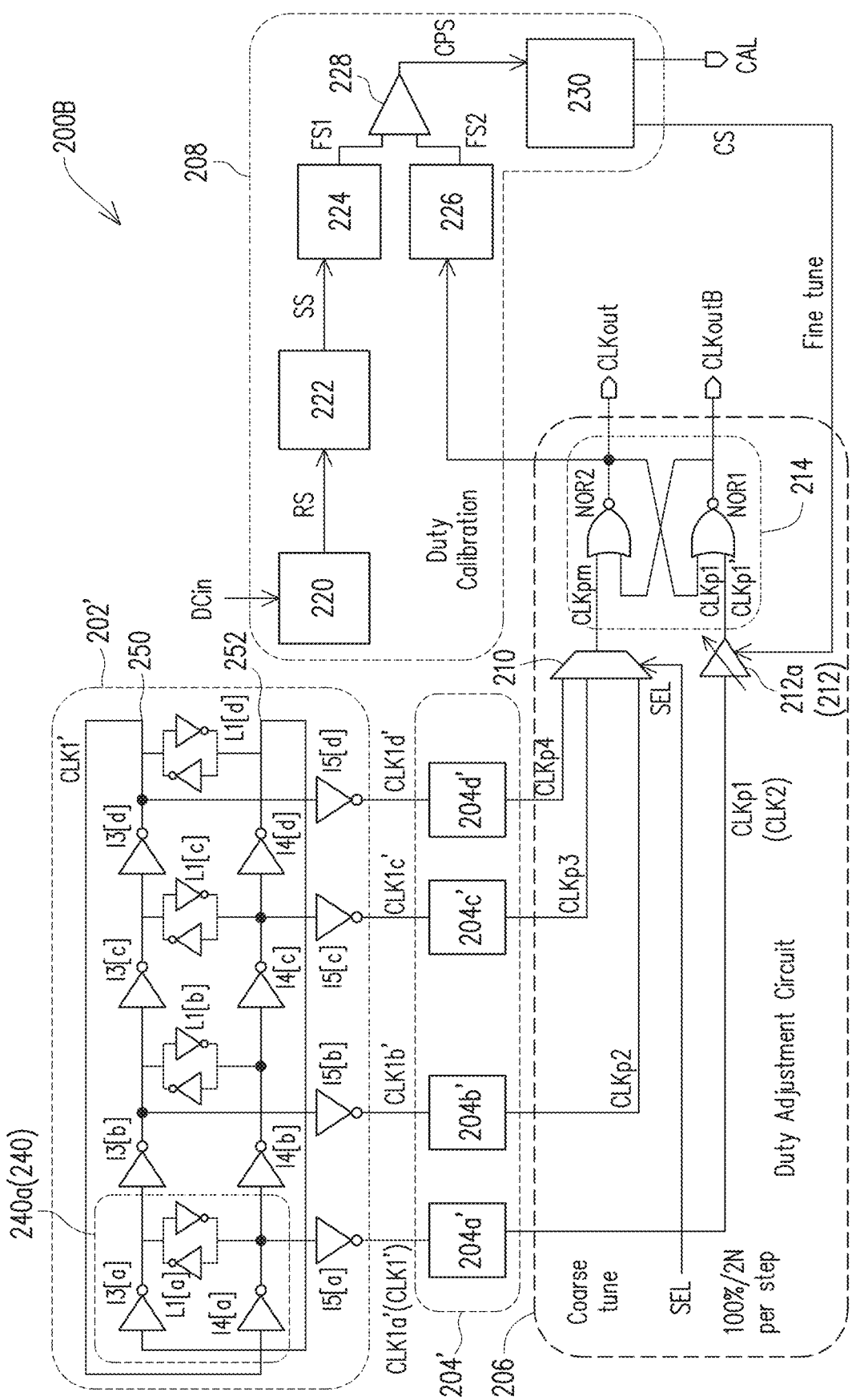
FIG. 2B is a circuit diagram of a circuit, in accordance with some embodiments.

In some embodiments, the duty cycle adjustment circuit 206 is configured to adjust the duty cycle DC2 of the first phase clock output signal CLKout responsive to a phase difference $\Delta\varphi 2$ between the first phase clock signal CLKp1 or CLKp1' and the second phase clock signal CLKpm. For example, in some embodiments, as the phase difference $\Delta\varphi 2$ between the first phase clock signal CLKp1 or CLKp1' and the second phase clock signal CLKpm increases, the duty cycle DC2 of the first phase clock output signal CLKout increases. For example, in some embodiments, as the phase difference $\Delta\varphi 2$ between the first phase clock signal CLKp1 or CLKp1' and the second phase clock signal CLKpm decreases, the duty cycle DC2 of the first phase clock output signal CLKout decreases. In some embodiments, the phase difference $\Delta\varphi 2$ is related to the number of stages N in ring oscillator 202 or 202' (FIG. 2B).

The duty cycle adjustment circuit 206 includes a multiplexer 210, an adjustable delay circuit 212 and an edge triggered flip-flop 214.

Multiplexer 210 is coupled to a sub-set of level shifters of the set of level shifters 204. For example, multiplexer 210 is coupled to level shifters 204b, 204c, 204d and 204e of the set of level shifter 204. Multiplexer 210 is configured to receive a sub-set of phase clock signals (e.g., CLKp2, CLKp3, CLKp4, CLKp5) of the second set of phase clock signals CLK2 from a corresponding sub-set of level shifters (e.g., 204b, 204c, 204d, 204e) of the set of level shifters 204. For example, multiplexer 210 is configured to receive phase clock signals CLKp2, CLKp3, CLKp4, CLKp5 of the second set of phase clock signals CLK2 from corresponding level shifters 204b, 204c, 204d and 204e of the set of level shifter 204.

Multiplexer 210 is configured to receive a select control signal SEL. Multiplexer 210 is further coupled to the edge triggered flip-flop 214, and is configured to output the second phase clock signal CLKpm of the second set of phase clock signals CLK2 to the edge triggered flip-flop 214.

Multiplexer 210 is configured to output the second phase clock signal CLKpm of the second set of phase clock signals CLK2 responsive to select control signal SEL. For example, in some embodiments, the select control signal SEL determines which input signal (e.g., CLKp2, CLKp3, CLKp4, CLKp5) is output by multiplexer 210 as the second phase clock signal CLKpm of the second set of phase clock signals CLK2 to the edge triggered flip-flop 214.

The duty cycle DC2 of the first clock output signal CLKout is determined or adjusted by the use of select control signal SEL.

In some embodiments, multiplexer 210 is configured to provide a coarse tuning of the duty cycle DC2 of the first clock output signal CLKout by the use of select control signal SEL. In some embodiments, multiplexer 210 is configured to set or adjust the duty cycle DC2 of the first clock output signal CLKout by a duty cycle adjustment step DS1.

Figure 4:
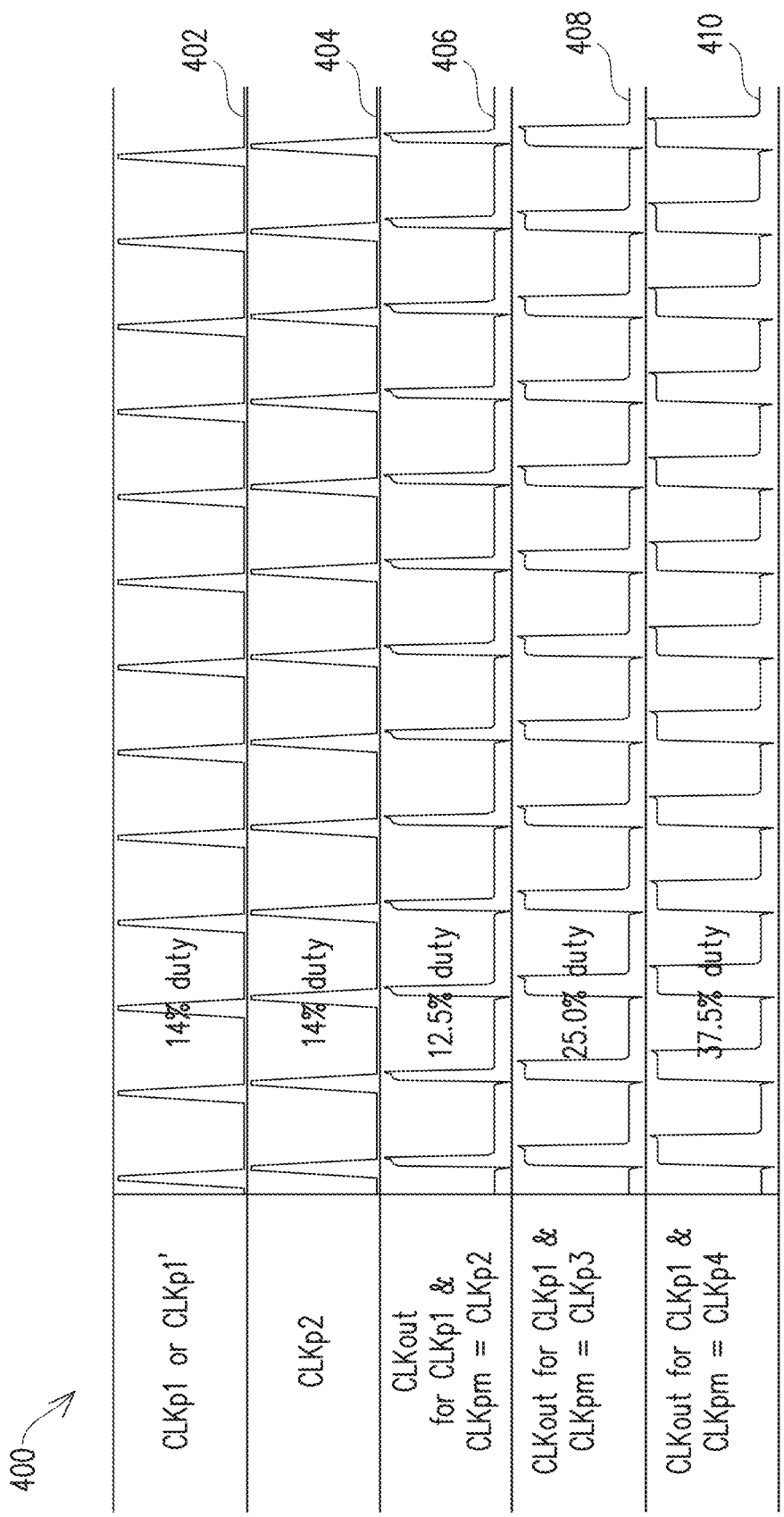
FIG. 4 is a graph of waveforms of a circuit, in accordance with some embodiments.

Additional details of the operation of adjustable duty cycle circuit 206 and multiplexer 210 with respect to waveforms are further described in FIG. 4.

For example, in some embodiments, the duty cycle DC2 of the first phase clock output signal CLKout can be incremented, decremented or adjusted by an amount of the duty cycle adjustment step DS1. The duty cycle adjustment step DS1 is expressed by formula 1.

$$DS1 = 100\%/2\ N \qquad (1)$$

The duty cycle adjustment step DS1 is related to the number of stages N in ring oscillator 202 or 202' (FIG. 2B).

The duty cycle DC2 of the first phase clock output signal CLKout is expressed by formula 2.

$$DC2 = (100\%/2\ N)*L = DS1*L \qquad (2)$$

In some embodiments, L is an integer corresponding to a number of duty cycle adjustment steps ranging from 1 to N-1. For example, in some embodiments, the duty cycle DC2 of the first phase clock output signal CLKout is determined or adjusted based on a number L of duty cycle adjustment steps DS1 (formula 1). In other words, based on a number of steps L selected, the duty cycle DC2 of the first phase clock output signal CLKout will be adjusted. In some embodiments, the duty cycle DC2 of the first clock output signal CLKout is calculated with respect to the first phase clock signal CLKp1. In other words, the first phase clock signal CLKp1 is used as a reference phase to calculate the duty cycle DC2.

In some embodiments, the number L of duty cycle adjustment steps DS1 is related to the select control signal SEL and the number of stages N in ring oscillator 202 or 202' (FIG. 2B). In some embodiments, each duty cycle adjustment step DS1 is associated with a corresponding phase difference Δφ2 between a pair of adjacent phase clock signals of the second set of phase clock signals CLK2.

In some embodiments, the number L (e.g., 1, 2, 3 or 4) of duty cycle adjustment steps DS1 is related to which corresponding signal (e.g., CLKp2, CLKp3, CLKp4 or CLKp5) is selected by select control signal SEL as the output of multiplexer 210 as the second phase clock signal CLK2. For example, each step (e.g., step 1, 2, 3, 4) is associated with a corresponding phase clock signal (e.g., CLKp1, CLKp2, CLKp3, CLKp4) selected as the output of multiplexer 210.

For example, in some embodiments, as shown in FIG. 2A, ring oscillator 202 has 5 stages such that N is equal to 5, and therefore the duty cycle adjustment step DS1 is equal to 10% per step. In other words, in this embodiment, the duty cycle DC2 of the first phase clock output signal CLKout can be incremented or adjusted by the duty cycle adjustment circuit 206 by 10% per step. However, in this embodiment, since N is equal to 5, the number of steps L is equal to 4. Thus, in this embodiment, the duty cycle DC2 of the first phase clock output signal CLKout can be incremented or adjusted by 10%, 20%, 30% or 40%. In some embodiments, the duty cycle adjustment step DS1 provides a coarse tuning of the duty cycle DC2 of the first clock output signal CLKout.

For example, in some embodiments, if multiplexer 210 selects phase clock signal CLKp2 as the second output signal CLKpm, then the number of steps L is 1, and duty cycle DC2 is adjusted by 10% per step and the total amount duty cycle DC2 is adjusted is 10%.

For example, in some embodiments, if multiplexer 210 selects phase clock signal CLKp3 as the second output signal CLKpm, then the number of steps L is 2, and duty cycle DC2 is adjusted by 10% per step and the total amount duty cycle DC2 is adjusted is 20%.

For example, in some embodiments, if multiplexer 210 selects phase clock signal CLKp4 as the second output signal CLKpm, then the number of steps L is 3, and duty cycle DC2 is adjusted by 10% per step and the total amount duty cycle DC2 is adjusted is 30%.

For example, in some embodiments, if multiplexer 210 selects phase clock signal CLKp5 as the second output signal CLKpm, then the number of steps L is 4, and duty cycle DC2 is adjusted by 10% per step and the total amount duty cycle DC2 is adjusted is 40%.

In some embodiments, multiplexer 210 is configured to receive select control signal SEL from an external user. In some embodiments, multiplexer 210 is configured to receive select control signal SEL from a controller 230. In some embodiments, multiplexer 210 is configured to receive select control signal from another circuit (not shown).

The adjustable delay circuit 212 is coupled to level shifter 204a of the set of level shifters 204 and the edge triggered flip-flop 214. The adjustable delay circuit 212 is configured to output an adjusted first phase clock signal CLKp1' or the first phase clock signal CLKp1 of the second set of phase clock signals CLK2 responsive to the first phase clock signal CKLp1 of the second set of phase clock signals CLK2 and the set of control signals CS. In some embodiments, the adjustable delay circuit 212 is configured to adjust the first phase clock output signal CLKout and the duty cycle DC2 responsive to at least a set of control signals CS. In some embodiments, the adjustable delay circuit 212 is a buffer circuit 212a configured to provide or adjust a delay to the adjusted first phase clock signal CLKp1' or the first phase clock signal CLKp1 thereby adjusting the duty cycle DC2. In some embodiments, by adjusting the delay provided to the adjusted first phase clock signal CLKp1' or the first phase clock signal CLKp1 results in a change in the duty cycle DC2 of the output clock signal CLKout.

In some embodiments, the amount of delay provided by adjustable delay circuit 212 or buffer circuit 212a is referred to as a fine tuning of the duty cycle DC2 of the first clock output signal CLKout. In some embodiments, adjustable delay circuit 212 or buffer circuit 212a is configured to adjust the duty cycle DC2 of the first clock output signal CLKout by about 1% to about 2% per step. Other adjustments to the duty cycle of the first clock output signal CLKout are within the scope of the present disclosure.

In some embodiments, the amount of delay provided by adjustable delay circuit 212 is based upon the set of control signals CS. For example, in some embodiments, the set of control signals are configured to adjust the supply voltage (not labelled) of the buffer circuit 212a. In some embodiments, an increase in the supply voltage (not labelled) provided to the buffer circuit 212a will reduce the delay provided by the buffer circuit. In some embodiments, a decrease in the supply voltage (not labelled) provided to the buffer circuit 212a will increase the delay provided by the buffer circuit.

In some embodiments, by adjusting the delay provided to the adjusted first phase clock signal CLKp1' or the first phase clock signal CLKp1 results in a change in the phase of adjusted first phase clock signal CLKp1' or the first phase clock signal CLKp1. In some embodiments, since an output of edge-triggered flip-flop 214 (described below) is based on the phase differences Δφ2 of the input, by changing the phase of adjusted first phase clock signal CLKp1' or the first phase clock signal CLKp1 results in a change in the duty cycle DC2 of the output clock signal CLKout.

Other configurations and circuit types to adjust the delay of the adjusted first phase clock signal CLKp1' or the first phase clock signal CLKp1 are within the scope of the present disclosure.

The edge triggered flip-flop 214 is coupled to multiplexer 210, adjustable delay circuit 212 and duty calibration circuit 208. The edge triggered flip-flop 214 is configured to output the first clock output signal CLKout responsive to the second phase clock signal CLKpm of the second set of phase clock signals CLK2, and either the adjusted first phase clock signal CLKp1' or the first phase clock signal CLKp1.

In some embodiments, clock output signal CLKout is generated by edge triggered flip-flop 214 based on the phase difference Δφ2 between the input signals (e.g., CLKpm and CLKp1 or CLKp1') of the edge triggered flip-flop 214. In some embodiments, the duty cycle DC2 of the clock output signal CLKout is based on the phase difference Δφ2 of the input signals (e.g., CLKpm and CLKp1 or CLKp1') of the edge triggered flip-flop 214.

In some embodiments, the duty cycle DC2 of the clock output signal CLKout is independent of the duty cycle DC1 of each of the adjusted first phase clock signal CKlp1', the first phase clock signal CLKp1 and the second phase clock signal CLKpm. In some embodiments, by being independent of the duty cycle of the input signals (e.g., CLKp1, CLKp1', CLKpm) provided to the edge triggered flip-flop 214, circuit 200A or 200B is more robust to corrupted input waveforms compared to other approaches.

In some embodiments, by being independent of the duty cycle of the input signals (e.g., CLKp1, CLKp1', CLKpm) provided to the edge triggered flip-flop 214, circuit 200A or 200B (FIG. 2B) is configured to output a clock output signal CLKout with a same frequency as the first set of phase clock signals CLK1 without the use of frequency dividers that occupy more area and extra complexity.

Figure 3:
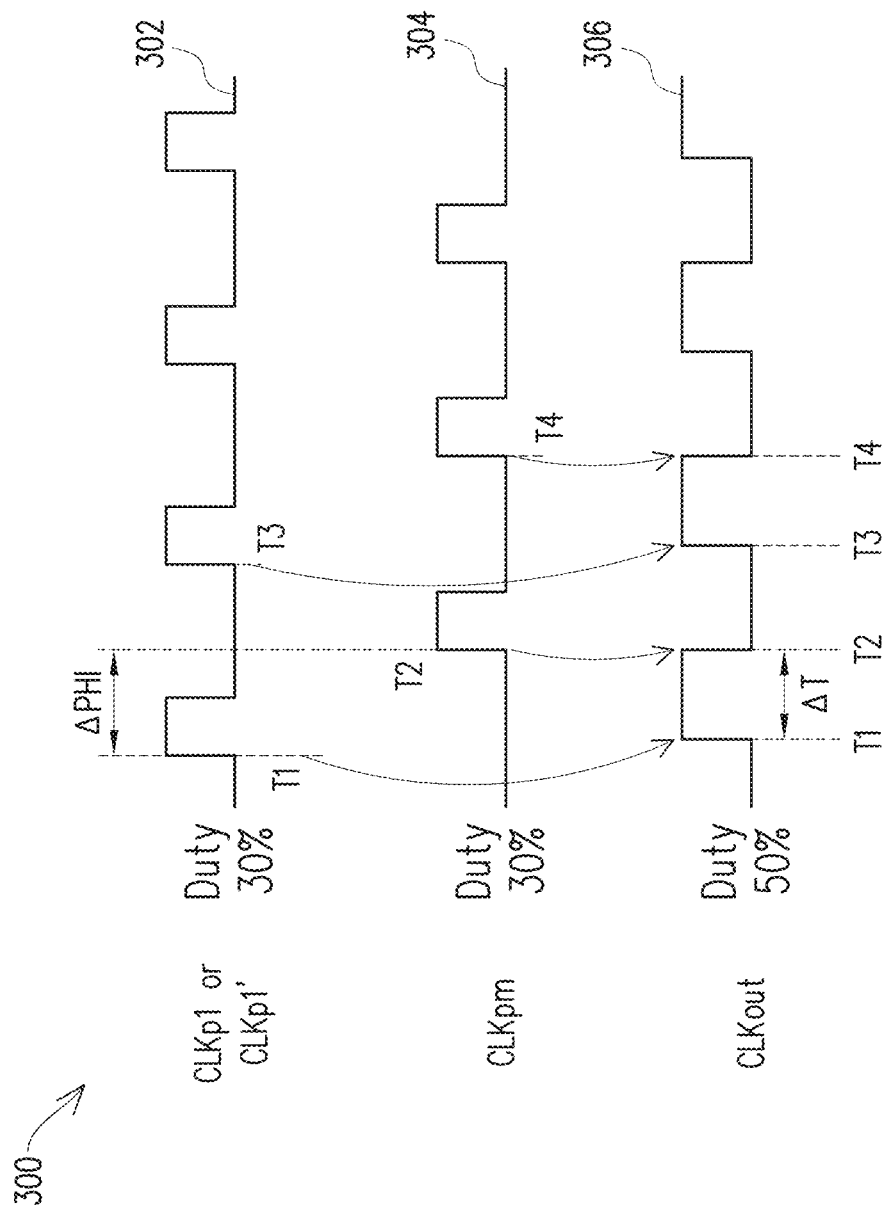
FIG. 3 is a graph of waveforms of a circuit, in accordance with some embodiments.

Additional details of the operation of edge triggered flip-flop 214 with respect to waveforms are further described in FIG. 3.

In some embodiments, the edge triggered flip-flop 214 includes an SR-flip-flop. In some embodiments, the edge triggered flip-flop includes an DQ flip-flop, a T flip-flop, a JK flip-flop, or the like.

The SR flip-flop includes a NOR logic gate NOR1 and a NOR logic gate NOR2.

The NOR logic gate NOR1 includes an output terminal configured to output the first clock output signal CLKout, and is coupled to the duty cycle calibration circuit 208 and a second input terminal of the NOR logic gate NOR2. The NOR logic gate NOR1 further includes a first input terminal coupled to the multiplexer 210, and a second input terminal coupled to an output terminal of the NOR logic gate NOR2.

The NOR logic gate NOR2 includes an output terminal configured to output an inverted first clock output signal CLKoutB and is coupled to the second input terminal of NOR logic gate NOR1. The NOR logic gate NOR2 further includes a first input terminal coupled to the adjustable delay circuit 212, and a second input terminal coupled to the output terminal of the NOR logic gate NOR1.

In some embodiments, the output terminal of NOR logic gate NOR2 is configured to generate an inverted first clock output signal CLKoutB having an inverted duty cycle DC2'. In some embodiments, inverted first clock output signal CLKoutB is inverted from the first clock output signal CLKout. In some embodiments, inverted duty cycle DC2' is inverted from duty cycle DC2. For example, in some embodiments, if the duty cycle of DC2 is equal to 20%, then inverted duty cycle DC2' is equal to 80%. In some embodiments, by having inverted duty cycle DC2' and duty cycle DC2, circuit 200A or 200B is configured to generate output signals (e.g., CLKout, CLKoutB) having a wide range of duty cycles (e.g., DC2, DC2').

Other configurations and other types of edge triggered circuits are within the scope of the present disclosure.

The duty cycle calibration circuit 208 is an embodiment of the duty cycle calibration circuit 108 of FIG. 1, and similar detailed description is omitted. The duty cycle calibration circuit 208 is coupled to the duty cycle adjustment circuit 206. In some embodiments, the duty cycle calibration circuit 208 is configured to receive at least the input duty cycle DCin or the first clock output signal CLKout having duty cycle DC2. The duty cycle calibration circuit 208 is configured to perform a calibration of the duty cycle DC2 of the first clock output signal CLKout based on an input duty cycle DCin, and to generate the set of control signals CS responsive to the calibration of duty cycle DC2. In some embodiments, duty cycle calibration circuit 108 is configured to compare the duty cycle DC2 of the first clock output signal CLKout and the input duty cycle DCin, and to generate the set of control signals CS based on the comparison of the duty cycle DC2 of the first clock output signal CLKout and the input cycle DCin. In some embodiments, by using the set of control signals CS, duty cycle calibration circuit 208 is configured to calibrate the duty cycle adjustment circuit 206 automatically and does not utilize analog voltage measurement on a chip level.

The duty cycle calibration circuit 208 includes a programmable duty reference generator circuit 220, scrambler circuit 222, a filter 224, a filter 226 a comparator 228 and a controller 230.

Programmable duty reference generator circuit 220 is configured to receive the input duty cycle DCin. In some embodiments, programmable duty reference generator circuit 220 is programmable based on the input duty cycle signal received. Programmable duty reference generator circuit 220 is coupled to the scrambler circuit 222. Programmable duty reference generator circuit 220 is configured to generate a duty cycle reference signal RS responsive to the input duty cycle DCin. In some embodiments, the input duty cycle DCin is received by a user. In some embodiments, the input duty cycle DCin is received by another circuit. In some embodiments, the duty cycle calibration circuit 208 adjusts the duty cycle DC2 of the first clock output signal CLKout based on the reference duty cycle signal RS.

In some embodiments, the input duty cycle DCin is a number expressed as a percentage. For example, in some embodiments, the input duty cycle DCin is equal to 33%.

In some embodiments, the duty cycle reference signal RS is a binary string of Y numbers corresponding to the input duty cycle DCin, where Y is an integer corresponding to the length of the binary string. For example, in some embodiments, for an input duty cycle DCin being equal to 33%, the duty cycle reference signal RS is "111100000000" for a binary string of 12 (Y=12) numbers. In this example, the binary string of 12 numbers includes four logic 1s and eight logic 0s, and the number of logic 1s divided by the length of the binary string Y (e.g., 4/12) corresponds to the input duty cycle of 33%.

Other types of data for input duty cycle DCin or duty cycle reference signal RS are within the scope of the present disclosure. Other circuit types or configurations of programmable duty reference generator circuit 220 are within the scope of the present disclosure.

Scrambler circuit 222 is coupled to the programmable duty reference generator circuit 220 and filter 224. Scrambler circuit 222 is configured to receive duty cycle reference signal RS from the programmable duty reference generator circuit 220. Scrambler circuit 222 is configured to generate a scrambled duty cycle signal SS responsive to the duty cycle reference signal RS.

Scrambled duty cycle signal SS is a rearranged or scrambled version of reference duty cycle RS. In some embodiments, scrambled duty cycle signal SS has a same length Y as the reference duty signal RS. In some embodiments, scrambler circuit 222 is configured to truncate the series of logic 1s and logic 0s of duty cycle reference signal RS by generating the scrambled signal SS. In some embodiments, the scrambler circuit 222 rearranges the string of logic 1s and logic 0s of duty cycle reference signal RS to be a shorter series of logic 1s and logic 0s in the scrambled duty cycle signal SS. For example, in some embodiments, for a duty cycle reference signal RS being "111100000000", the scrambled duty cycle signal SS is "100010001000" for a binary string of 12 (Y=12) numbers. Additional details of scrambler circuit 222 with respect to waveforms are further described in FIG. 7A. Other arrangements or types of data for scrambled signal SS are within the scope of the present disclosure.

In some embodiments, by rearranging the series of logic 1s and 0s, the frequency of the scrambled signal SS is increased compared with the frequency of the reference signal RS, but the duty cycle of the scrambled signal SS and the duty cycle of the reference signal RS is the same.

In some embodiments, scrambler circuit 222 is configured to reduce the differences between the filtered scrambled duty cycle signal FS1 and the filtered first clock output signal FS2 which makes the filtered scrambled duty cycle signal FS1 more accurate for comparator 228 and reduces calibration time. For example, in some embodiments, if the filtered scrambled duty cycle signal FS1 differs from the filtered first clock output signal FS2 by a larger amount, then the calibration of the duty cycle adjustment circuit 206 would increase. In some embodiments, by reducing the differences between the filtered scrambled duty cycle signal FS1 and the filtered first clock output signal FS2, scrambler circuit 222 reduces the calibration time of duty cycle adjustment circuit 206.

Other circuit types or configurations of scrambler circuit 222 are within the scope of the present disclosure.

Filter 224 is coupled to the scrambler circuit 222 and comparator 228. Filter 224 is configured to receive the scrambled duty cycle signal SS from the scrambler circuit 222. Filter 224 is configured to generate a filtered scrambled duty cycle signal FS1 responsive to the scrambled duty cycle signal SS.

Filter 226 is coupled to the edge triggered flip-flop 214 and comparator 228. Filter 226 is configured to receive the first clock output signal CLKout from the edge triggered flip-flop 214. Filter 226 is configured to generate a filtered first clock output signal FS2 responsive to the first clock output signal CLKout.

In some embodiments, filter 224 is a same type of filter as filter 226. In some embodiments, at least filter 224 or filter 226 is a low pass filter having a center frequency Fc equal to 0 hertz (Hz). In some embodiments, at least filter 224 or filter 226 is an RC low pass filter. In some embodiments, filter 224 and filter 226 are RC low pass filters with the same resistance R and capacitance C values.

In some embodiments, filter 224 includes a first resistor R1 (not shown) coupled in series with a first capacitor C1 (not shown). In some embodiments, the first resistor R1 (not shown) has a first resistance and the first capacitor C1 (not shown) has a first capacitance.

In some embodiments, filter 226 includes a second resistor R2 (not shown) coupled in series with a second capacitor C2 (not shown). In some embodiments, the second resistor R2 (not shown) has a second resistance and the second capacitor C2 (not shown) has a second capacitance.

In some embodiments, the first resistance of the first resistor R1 is equal to the second resistance of the second resistor R2. In some embodiments, the first capacitance of the first resistor R1 is equal to the second capacitance of the second resistor R2.

Other filter types or configurations of filter 224 or 226 are within the scope of the present disclosure.

Comparator 228 is coupled to filter 224 and filter 226. Comparator 228 is configured to receive filtered scrambled duty cycle signal FS1 from scrambler circuit 222, and filtered first clock output signal FS2 from edge triggered flip-flop 214. Comparator 228 is configured to generate a comparison signal CPS based on a comparison of the filtered scrambled duty cycle signal FS1 and the filtered first clock output signal FS2. In some embodiments, comparator 228 is configured to detect a relationship between the filtered scrambled duty cycle signal FS1 and the filtered first clock output signal FS2. In some embodiments, comparator 228 is configured to compare the filtered scrambled duty cycle signal FS1 and the filtered first clock output signal FS2. Comparator 228 is configured to output comparison signal CPS to the controller 230.

In some embodiments, comparison signal CPS corresponds to a digital signal with a binary value. In some embodiments, comparison signal CPS corresponds to a logic 1, if the voltage of filtered scrambled duty cycle signal FS1 is greater than the filtered first clock output signal FS2. In some embodiments, comparison signal CPS corresponds a logic 0, if the voltage of filtered scrambled duty cycle signal FS1 is less than the filtered first clock output signal FS2. Other logic values of comparison signal CPS are within the scope of the present disclosure.

Controller 230 is coupled to comparator 228 and delay adjustment circuit 212. Controller 230 is configured to generate the set of control signals CS responsive to the comparison signal COS. In some embodiments, controller 230 is further configured to generate a calibration flag signal CAL responsive to the comparison signal COS.

Figure 10:
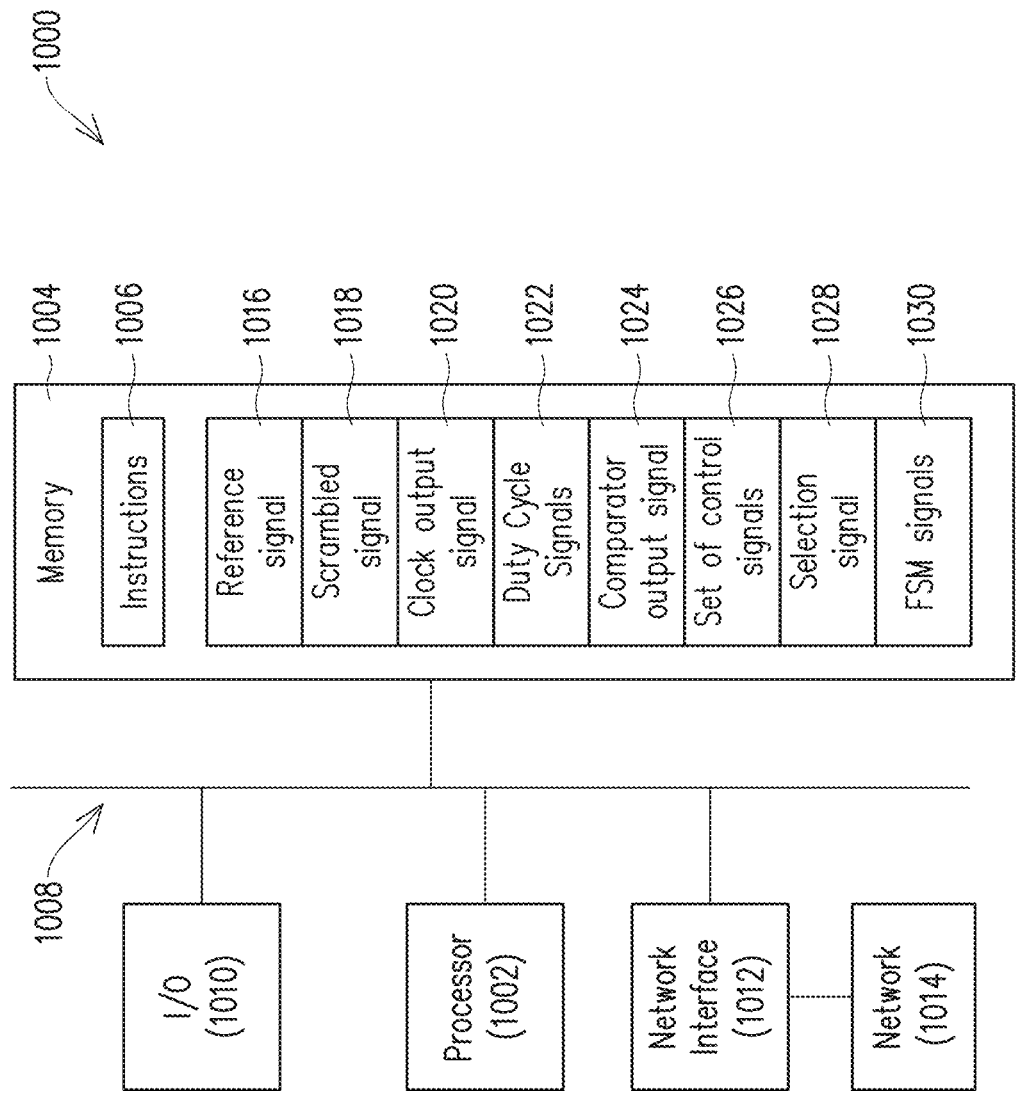
FIG. 10 is a schematic view of a controller, in accordance with some embodiments.

At least the set of control signals CS or the calibration flag signal CAL is stored in memory 1004 (shown in FIG. 10) in controller 230 or controller 1000 (FIG. 10). In some embodiments, each set of control signals CS has a corresponding configuration or calibration of duty cycle adjustment circuit 206.

Figure 8:
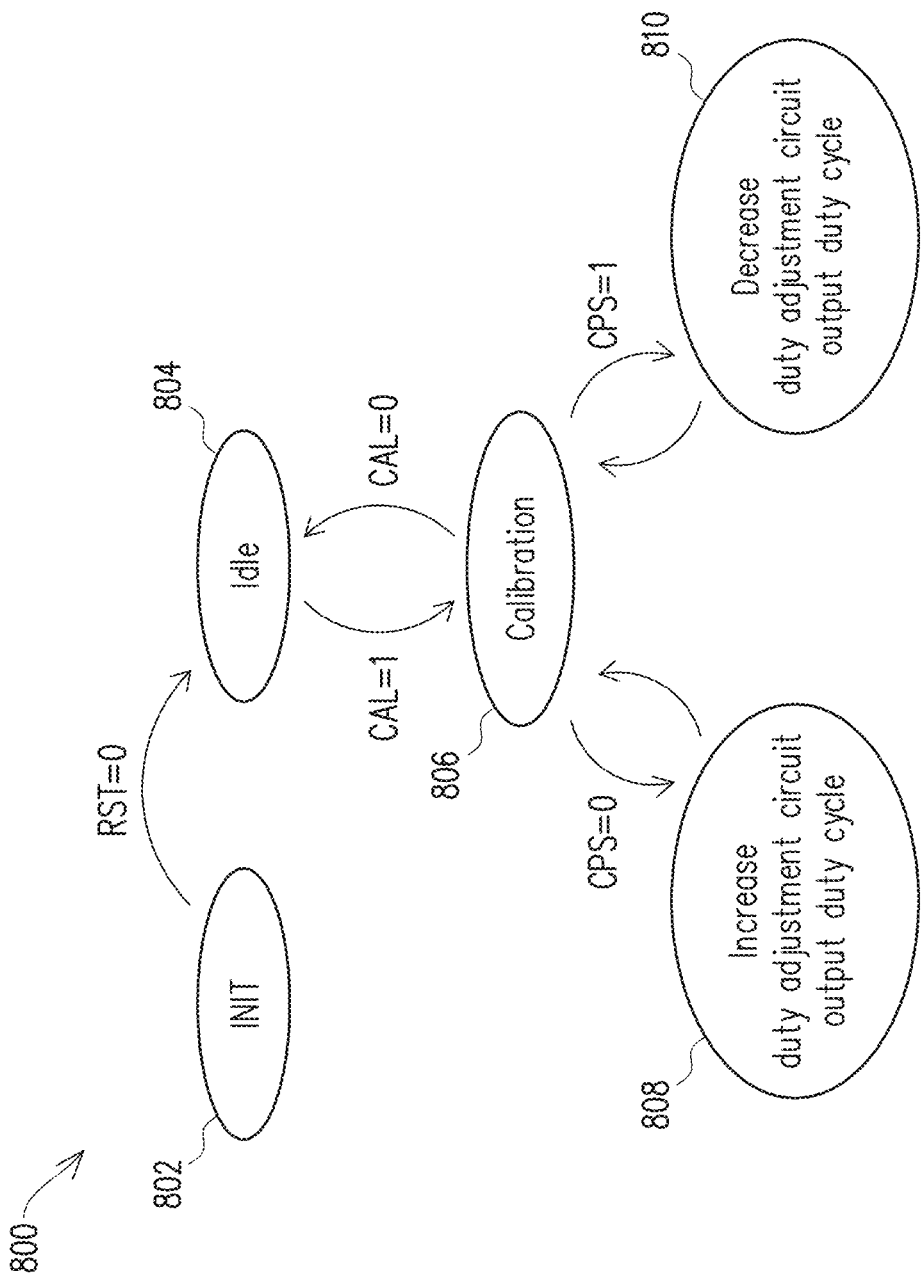
FIG. 8 is a diagram of a state transition of a circuit, in accordance with some embodiments.

In some embodiments, controller 230 is a duty calibration finite state machine (FSM). In some embodiments, controller 214 corresponds to a programmable logic device, a programmable logic controller, one or more logic gates, one or more flip-flops, one or more relay devices or the like. In some embodiments, a state diagram of the duty calibration finite state machine of controller 230 is shown in FIG. 8. In some embodiments, if the calibration flag signal CAL has a certain value (discussed in FIG. 8), then controller 230 is configured to enter an idle state such that the set of control signals CS are configured to not change or adjust circuit the duty cycle DC2 of the clock output signal CLKout of duty cycle adjustment circuit 206.

In some embodiments, controller 230 is further coupled to multiplexer 210, and is further configured to generate the select control signal SEL which is utilized for additional coarse tuning of the clock output signal CLKout of duty cycle adjustment circuit 206.

Other configurations of controller 230 are within the scope of the present disclosure.

FIG. 2B is a circuit diagram of a circuit 200B, in accordance with some embodiments.

Circuit 200B is an embodiment of circuit 100 of FIG. 1.

Circuit 200B is a variation of circuit 200A, and similar detailed description is therefore omitted. For example, circuit 200B illustrates an example of where a ring oscillator 202' includes an even number of stages.

Components that are the same or similar to those in one or more of FIGS. 1, 2A-2B, 3, 4-6, 7A-7B, 8-10 (shown below) are given the same reference numbers, and detailed description thereof is thus omitted.

In comparison with circuit 200A of FIG. 2A, ring oscillator 202' replaces ring oscillator 202, set of level shifters 204' replaces set of level shifters 204, the first set of phase clock signals CLK1' replaces the first set of phase clock signals CLK1, and similar detailed description is therefore omitted.

Circuit 200B comprises ring oscillator 202', the set of level shifter circuits 204', a duty cycle adjustment circuit 206 and a duty cycle calibration circuit 208.

In comparison with circuit 200A of FIG. 2A, ring oscillator 202' is a differential ring oscillator having an even number of stages. In other words, the number of stages N for ring oscillator 202' is an even number.

Ring oscillator 202' is an embodiment of clock generating circuit 102 of FIG. 1, and similar detailed description is omitted. Ring oscillator 202' is configured to generate the first set of phase clock signals CLK1'.

The first set of phase clock signals CLK1' is a variation of the first set of phase clock signals CLK1 of FIG. 2A, and similar detailed description is omitted. In comparison with the first set of phase clock signals CLK1, the first set of phase clock signals CLK1' does not include CLK1e. In some embodiments, the first set of phase clock signals CLK1' includes at least a phase clock signal CLK1a', CLK1b', CLK1c' or CLK1d'. In some embodiments, phase clock signal CLK1a', CLK1b', CLK1c' or CLK1d' is similar to corresponding phase clock signal CLK1a, CLK1b, CLK1c or CLK1d, and similar detailed description is therefore omitted.

Ring oscillator 202' has N stages (collectively referred to as "a set of stages" (not labelled)), where N is an integer corresponding to the number of stages in ring oscillator 202'. In some embodiments, the number of stages N of the set of stages (not labelled) is even.

Each stage of the set of stages is configured to generate a corresponding phase clock signal CLK1a', CLK1b', CLK1c' or CLK1d' of the first set of phase clock signals CLK1'. In some embodiments, a number of phase clock signals of the first set of phase clock signals CLK1' is even, and is equal to integer N. Other numbers of stages N or phase clock signals of the first set of phase clock signals CLK1' are within the scope of the present disclosure.

Ring oscillator 202' comprises a third set of inverters I3, a fourth set of inverters I4, the fifth set of inverters I5 and a set of latches L1.

The third set of inverters I3 and the fourth set of inverters I4 are similar to the first set of inverters I1, and similar detailed description is therefore omitted.

The third set of inverters I3 includes at least inverter I3[a], I3[b], I3[c] or I3[d]. The third set of inverters I3 are arranged on a first path 250 having a first end (not labelled) and a second end (not labelled) opposite from the first end.

The fourth set of inverters I4 includes at least inverter I4[a], I4[b], I4[c] or I4[d]. The fourth set of inverters I4 are arranged on a second path 252 having a first end (not labelled) and a second end (not labelled) opposite from the first end. In some embodiments, the second end of the first path 250 is coupled to the first end of the second path 252. In some embodiments, the first end of the first path 250 is coupled to the second end of the second path 252.

In some embodiments, at least one inverter of the third set of inverters I3 is coupled to at least one inverter of the fourth set of inverters I4.

An output terminal of inverter I3[a] is coupled to an input terminal of inverter I3[b]. An output terminal of inverter I3[b] is coupled to an input terminal of inverter I3[c]. An output terminal of inverter I3[c] is coupled to an input terminal of inverter I3[d]. An output terminal of inverter I3[d] is coupled to an input terminal of inverter I4[a].

An output terminal of inverter I4[a] is coupled to an input terminal of inverter I4[b]. An output terminal of inverter I4[b] is coupled to an input terminal of inverter I4[c]. An output terminal of inverter I4[c] is coupled to an input terminal of inverter I4[d]. An output terminal of inverter I4[d] is coupled to an input terminal of inverter I3[a].

In some embodiments, each inverter of the third set of inverters I3 or each inverter of the fourth set of inverters I4 corresponds to a stage of the set of stages (not labelled). In some embodiments, a number of inverters of the third set of inverters I3 or the fourth set of inverters I4 is even.

The set of latches L1 includes at least a latch L1[*a*], L1[*b*], L1[*c*] or L1[*d*]. In some embodiments, at least latch L1[*a*], L1[*b*], L1[*c*] or L1[*d*] of the set of latches L1 is configured to latch or store a state of the input signal. In some embodiments, each latch of the set of latches L1 includes a pair of inverters (not labelled) coupled to each other.

A first terminal of latch L1[*a*] is coupled to the input terminal of inverter I3[*b*] and the output terminal of inverter I3[*a*]. A second terminal of latch L1[*a*] is coupled to the input terminal of inverter I4[*b*], the output terminal of inverter I4[*a*] and an input terminal of inverter I5[*a*].

A first terminal of latch L1[*b*] is coupled to the input terminal of inverter I3[*c*], the output terminal of inverter I3[*b*] and an input terminal of inverter I5[*b*]. A second terminal of latch L1[*b*] is coupled to the input terminal of inverter I4[*c*] and the output terminal of inverter I4[*b*].

A first terminal of latch L1[*c*] is coupled to the input terminal of inverter I3[*d*] and the output terminal of inverter I3[*c*]. A second terminal of latch L1[*c*] is coupled to the input terminal of inverter I4[*d*], the output terminal of inverter I4[*c*] and an input terminal of inverter I5[*c*].

A first terminal of latch L1[*d*] is coupled to the input terminal of inverter I4[*a*], the output terminal of inverter I3[*d*] and an input terminal of inverter I5[*d*]. A second terminal of latch L1[*d*] is coupled to the input terminal of inverter I3[*a*] and the output terminal of inverter I4[*d*].

In comparison with ring oscillator 202 of FIG. 2A, the fifth set of inverters I5 replaces the second set of inverters I2 and the set of buffers B1, and similar detailed description is therefore omitted.

The fifth set of inverters I5 at least inverter I5[*a*], I5[*b*], I5[*c*] or I5[*d*]. Inverters I5[*a*], I5[*b*], I5[*c*] and I5[*d*] are configured to generate corresponding phase clock signals CLK1*a'*, CLK1*b'*, CLK1*c'* and CLK1*d'* of the first set of phase clock signals CLK1'.

An output terminal of corresponding inverter I5[*a*], I5[*b*], I5[*c*] and I5[*d*] is coupled to a corresponding input terminal of level shifter 204*a'*, 204*b'*, 204*c'* and 204*d'* of the set of level shifters 204'.

In some embodiments, each inverter of the fifth set of inverters I5 is coupled to a corresponding stage of the set of stages of the ring oscillator 202' and a corresponding level shifter of the set of level shifters 204'.

In some embodiments, ring oscillator 202' is a differential 4 stage ring oscillator 240. In some embodiments, inverter I3[*a*], inverter I4[*a*] and latch L1[*a*] are a differential stage 240*a* of ring oscillator 202'. In some embodiments, inverter I3[*b*], inverter I4[*b*] and latch L1[*b*] are a differential stage 240*b* (not labelled) of ring oscillator 202'. In some embodiments, inverter I3[*c*], inverter I4[*c*] and latch L1[*c*] are a differential stage 240*c* (not labelled) of ring oscillator 202'. In some embodiments, inverter I3[*d*], inverter I4[*d*] and latch L1[*d*] are a differential stage 240*d* (not labelled) of ring oscillator 202'.

The set of level shifter circuits 204' is a variation of the set of level shifter circuits 204 of FIG. 2A, and similar detailed description is omitted. In comparison with the set of level shifter circuits 204, the set of level shifter circuits 204' does not include level shifter circuit 204*e*.

The set of level shifter circuits 204' is coupled to ring oscillator 202' and the duty cycle adjustment circuit 206. The set of level shifter circuits 204' includes level shifter circuits 204*a*, 204*b*, 204*c* and 204*d*.

The set of level shifter circuits 204' is configured to generate the second set of phase clock signals CLK2. In some embodiments, the second set of phase clock signals CLK2 includes at least a phase clock signal CLKp1, CLKp2, CLKp3 or CLKp4. In some embodiments, each level shifter of the set of level shifters 204' is configured to generate or output a corresponding phase clock signal CLKp1, CLKp2, CLKp3, CLKp4 of the second set of phase clock signals CLK2 based on a corresponding phase clock signal CLK1*a'*, CLK1*b'*, CLK1*c'*, CLK1*d'* of the first set of phase clock signals CLK1'. In some embodiments, each level shifter of the set of level shifters 204' is coupled to a corresponding stage of the set of stages (not labelled) of the ring oscillator 202'.

Figures 2C, 2D:
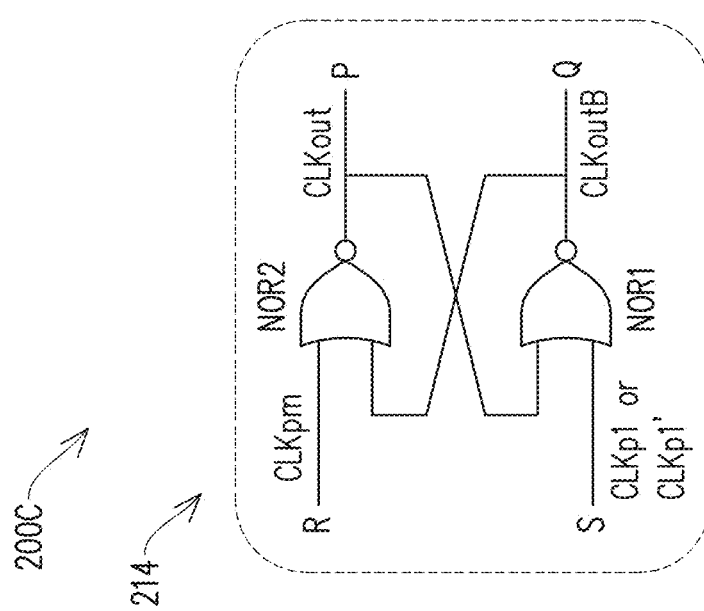
FIG. 2C is a circuit diagram of a circuit, in accordance with some embodiments.
FIG. 2D is a truth table of a circuit, in accordance with some embodiments.

FIG. 2C is a zoomed in portion 200C of edge trigged flip-flop 214 of circuit 200A in FIG. 2A or circuit 200B in FIG. 2B, in accordance with some embodiments. FIG. 2D is a truth table 200D of the edge trigged flip-flop 214 of circuit 200A in FIG. 2A or circuit 200B in FIG. 2B, in accordance with some embodiments.

As shown in FIG. 2C, edge triggered flip-flop 214 has Set (S) and Reset (R) inputs and P and Q outputs. The R input of the edge triggered flip-flop 214 of FIG. 2C corresponds to the second phase clock signal CLKpm. The S input of the edge triggered flip-flop 214 of FIG. 2C corresponds to the adjusted first phase clock signal CLKp1' or first phase clock signal CLKp1. The P output of the edge triggered flip-flop 214 of FIG. 2C corresponds to the first output clock signal CLKout. The Q output of the edge triggered flip-flop 214 of FIG. 2C corresponds to the inverted first output clock signal CLKoutB.

As shown in FIG. 2D, if the S input is a logic 1 and the R input is a logic 0, then the P output is a logic 1. As shown in FIG. 2D, if the S input is a logic 0 and the R input is a logic 1, then the P output is a logic 0.

Waveforms

FIG. 3 is a graph of waveforms 300 of a circuit, such as circuit 200A in FIG. 2A or 200B in FIG. 2B, in accordance with some embodiments.

Waveforms 300 include waveforms of signals in a duty cycle adjustment of the first phase clock signal CLKp1 and the second phase clock signal CLKpm performed by edge triggered flip-flop 214 of duty cycle adjustment circuit 206 of FIGS. 2A-2B. In this illustration, curve 302 has a 30% duty cycle, curve 304 has a 30% duty cycle and curve 306 has a duty cycle of 50%. In some embodiments, waveforms 300 include waveforms of signals in a duty cycle adjustment of the adjusted first phase clock signal CLKp1' and second phase clock signal CLKpm performed by edge triggered flip-flop 214 of duty cycle adjustment circuit 206 of FIGS. 2A-2B.

In some embodiments, curve 302 represents first phase clock signal CLKp1 or adjusted first phase clock signal CLKp1' of FIGS. 1 & 2A-2C received by an input terminal of the edge triggered flip-flop 214; curve 304 represents second phase clock signal CLKpm received by an input terminal of the edge triggered flip-flop 214; and curve 306 represents the first clock output signal CLKout output by the output terminal of the edge triggered flip-flop 214.

In some embodiments, a first edge of curve 302 and a first edge of curve 304 are offset from one another by a phase difference ΔPHI. In some embodiments, phase difference ΔPHI corresponds to the phase difference Δφ2 of FIGS. 2A-2C.

In some embodiments, curve 306 has a duty cycle ΔT defined between a first end point of curve 306 and a second end point of curve 306. In some embodiments, the duty cycle ΔT of curve 306 corresponds to the duty cycle DC2 of the first output clock signal CLKout of FIGS. 2A-2C.

In some embodiments, curve 306 is generated by edge triggered flip-flop 214 based on the phase difference ΔPHI between the input signals (e.g., curve 302 and curve 304) of the edge triggered flip-flop 214. In some embodiments, the duty cycle ΔT of curve 306 is based on the phase difference ΔPHI of the input signals (e.g., curve 302 and curve 304) of the edge triggered flip-flop 214.

At time T1, curve 302 transitions from a low logical value to a high logical value causing curve 306 to transition from a low logical value to a high logical value. In other words, since edge triggered flip-flop 214 is an edge triggered device, the transition of the input signal (e.g., first phase clock signal CLKp1) of edge triggered flip-flop 214 from a low logical value to a high logical value causes the output signal (e.g., first output clock signal CLKout) of edge triggered flip-flop 214 to also transition from a low logical value to a high logical value (as shown by curve 306). Thus, the edge of curve 302 is used to generate a first edge of curve 306 which defines a first end point of a duty cycle ΔT of curve 306. In some embodiments, the duty cycle ΔT of curve 306 corresponds to the duty cycle DC2 of the first output clock signal CLKout. For example, in some embodiments, the transition of curve 302 and curve 306 at time T1 corresponds to the entry of row 1 of Table 200D of FIG. 2D.

After time T1 and before time T2, curve 302 transitions from a high logical value to a low logical value, but curve 306 is not affected by this transition of curve 302. For example, in some embodiments, this transition of curve 302 corresponds to a transition from row 1 to row 2 of the entries shown in Table 200D of FIG. 2D, and the P output of edge triggered flip-flop 214 is not affected (e.g., the last state is latched) by this change on the input.

At time T2, curve 304 transitions from a low logical value to a high logical value causing curve 306 to transition from a high logical value to a low logical value. In other words, since edge triggered flip-flop 214 is an edge triggered device, the transition of the input signal (e.g., second phase clock signal CLKpm) of edge triggered flip-flop 214 from a low logical value to a high logical value causes the output signal (e.g., first output clock signal CLKout) of edge triggered flip-flop 214 to transition from a high logical value to a low logical value (as shown by curve 306). Thus, the edge of curve 304 is used to generate a second edge of curve 306 which defines a second end point of a duty cycle ΔT of curve 306. In some embodiments, the duty cycle ΔT of curve 306 corresponds to the duty cycle DC2 of the first output clock signal CLKout.

For example, in some embodiments, the transition of curve 304 and curve 306 at time T2 corresponds to a transition from row 2 to row 3 of the entries shown in Table 200D of FIG. 2D, and the P output of edge triggered flip-flop 214 transitions from a logical 1 to a logical 0.

After time T2 and before time T3, curve 304 transitions from a high logical value to a low logical value, but curve 306 is not affected by this transition of curve 304. For example, in some embodiments, this transition of curve 304 corresponds to a transition from row 3 to row 4 of the entries shown in Table 200D of FIG. 2D, and the P output of edge triggered flip-flop 214 is not affected (e.g., the last state is latched) by this change on the input.

The waveforms of curves 302, 304 and 306 from times T3 to T4 are similar to corresponding times T1 to T2, and similar detailed description is therefore omitted for the sake of brevity.

In some embodiments, the duty cycle ΔT of curve 306 is independent of the duty cycle 30% of each of curve 302 and curve 304. In some embodiments, by being independent of the duty cycle 30% of the input signals (e.g., curve 302 and curve 304) provided to the edge triggered flip-flop 214, circuit 200A or 200B is more robust to corrupted input waveforms compared to other approaches.

In some embodiments, by being independent of the duty cycle 30% of the input signals (e.g., curve 302 and curve 304) provided to the edge triggered flip-flop 214, circuit 200A or 200B (FIG. 2B) is configured to output a clock output signal CLKout (curve 306) with a same frequency as the input signals without the use of frequency dividers that occupy more area and extra complexity.

FIG. 4 is a graph of waveforms 400 of a circuit, such as circuit 200A in FIG. 2A or 200B in FIG. 2B, in accordance with some embodiments.

Waveforms 400 include waveforms of signals in a duty cycle adjustment of the first phase clock signal CLKp1 and the second phase clock signal CLKpm performed by edge triggered flip-flop 214 of duty cycle adjustment circuit 206 of FIGS. 2A-2B.

In this illustration, curve 402 has a 14% duty cycle, curve 404 has a 14% duty cycle, curve 406 has a 12.5% duty cycle, curve 408 has a 25% duty cycle, curve 410 has a 37.5% duty cycle, and curve 412 has a 50% duty cycle.

In some embodiments, waveforms 400 include waveforms of signals in a duty cycle adjustment of the adjusted first phase clock signal CLKp1' and second phase clock signal CLKpm performed by edge triggered flip-flop 214 of duty cycle adjustment circuit 206 of FIGS. 2A-2B.

In some embodiments, curve 402 represents first phase clock signal CLKp1 or adjusted first phase clock signal CLKp1' of FIGS. 1 & 2A-2C received by an input terminal of the edge triggered flip-flop 214; curve 404 represents phase clock signal CLKp2 received by an input terminal of the multiplexer 210 and output by multiplexer 210 as the second phase clock signal CLKpm to the input terminal of the edge triggered flip-flop 214; curve 406 represents the first clock output signal CLKout output by the output terminal of the edge triggered flip-flop 214 when phase clock output signal CLKp2 is selected by multiplexer 210 as the second phase clock signal CLKpm; curve 408 represents the first clock output signal CLKout output by the output terminal of the edge triggered flip-flop 214 when phase clock output signal CLKp3 is selected by multiplexer 210 as the second phase clock signal CLKpm; curve 410 represents the first clock output signal CLKout output by the output terminal of the edge triggered flip-flop 214 when phase clock output signal CLKp4 is selected by multiplexer 210 as the second phase clock signal CLKpm; and curve 412 represents the first clock output signal CLKout output by the output terminal of the edge triggered flip-flop 214 when phase clock output signal CLKp5 is selected by multiplexer 210 as the second phase clock signal CLKpm.

In some embodiments, multiplexer 210 is configured to provide a coarse tuning of the duty cycle DC2 of the first clock output signal CLKout by the use of select control signal SEL. In some embodiments, multiplexer 210 is configured to adjust the duty cycle DC2 of the first clock output signal CLKout by the duty adjustment step DS1.

For example, in some embodiments, as shown in FIG. 2B, ring oscillator 202 has 4 stages such that N is equal to 4, and therefore the duty cycle adjustment step DS1 is equal to 12.5% per step. In other words, in this embodiment, the duty cycle DC2 of the first phase clock output signal CLKout can be incremented or adjusted by the duty cycle adjustment circuit 206 by 12.5% per step. However, in this embodiment, since N is equal to 4, the number of steps L is equal to 3. Thus, in this embodiment, the duty cycle DC2 of the first phase clock output signal CLKout can be incremented or adjusted by 12.5%, 25% or 37.5%.

For example, in some embodiments, if multiplexer 210 selects phase clock signal CLKp2 (e.g., curve 406) as the second output signal CLKpm, then the number of steps L is 1, and duty cycle DC2 is adjusted by 12.5% per step and the total amount duty cycle DC2 is adjusted is 12.5%.

For example, in some embodiments, if multiplexer 210 selects phase clock signal CLKp3 (e.g., curve 408) as the second output signal CLKpm, then the number of steps L is 2, and duty cycle DC2 is adjusted by 12.5% per step and the total amount duty cycle DC2 is adjusted is 25%.

For example, in some embodiments, if multiplexer 210 selects phase clock signal CLKp4 (e.g., curve 410) as the second output signal CLKpm, then the number of steps L is 3, and duty cycle DC2 is adjusted by 12.5% per step and the total amount duty cycle DC2 is adjusted is 37.5%.

Level Shifter Circuit

Figure 5:
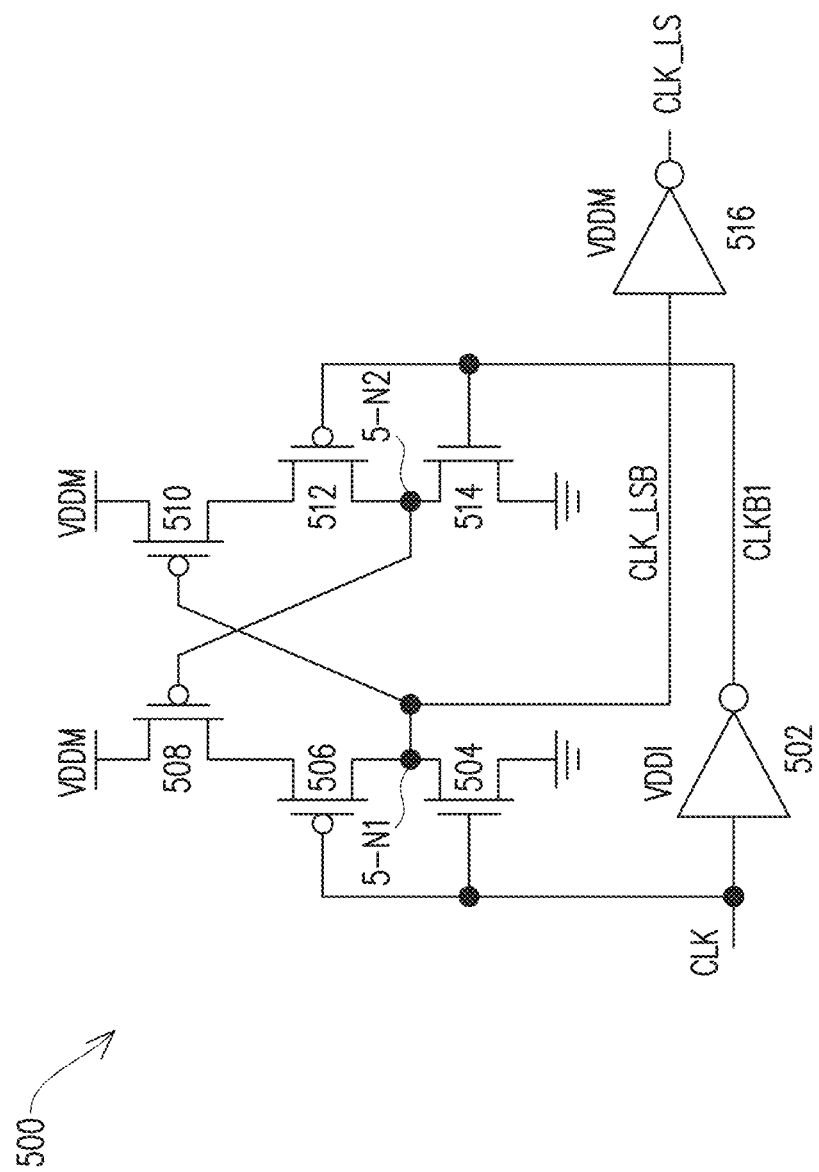
FIG. 5 is a circuit diagram of a level shifter circuit, in accordance with some embodiments.

FIG. 5 is a circuit diagram of a level shifter circuit 500, in accordance with some embodiments.

Level shifter circuit 500 is an embodiment of at least a level shifter circuit of the set of level shifter circuits 104 of FIG. 1, at least a level shifter circuit of the set of level shifter circuits 204 of FIG. 2A or at least a level shifter circuit of the set of level shifter circuits 204' of FIG. 2B, and similar detailed description is omitted.

Level shifter circuit 500 is a clock level shifter circuit configured to shift clock signals from a low voltage domain that uses a supply voltage VDDI to a high voltage domain that uses a supply voltage VDDM.

In some embodiments, level shifter circuit 500 is configured to receive a clock signal CLK. In some embodiments, clock signal CLK corresponds to one or more phase clock signals of the first set of phase clock signals CLK1 or CLK1' (FIG. 1 or 2A-2B)

In some embodiments, level shifter circuit 500 is useable to generate a clock signal CLK_LS. In some embodiments, clock signal CLK_LS corresponds to one or more phase clock signals of the second set of phase clock signals CLK2 (FIG. 1 or 2A-2B).

Level shifter circuit 500 is configured to receive signal CLK on an input terminal (not labelled), and to output a signal CLK_LS on an output terminal (not labeled). Signal CLK corresponds to an input signal of level shifter circuit 500, and signal CLK_LS corresponds to an output signal of level shifter circuit 500. Level shifter circuit 500 is configured to generate signal CLK_LS based on signal CLK.

Signal CLK_LS corresponds to a level shifted version of signal CLK. In some embodiments, a voltage level of signal CLK of level shifter circuit 500 is less than a voltage level of the signal CLK_LS of level shifter circuit 500. In some embodiments, the voltage level of signal CLK of level shifter circuit 500 is greater than the voltage level of signal CLK_LS of level shifter circuit 500.

Level shifter circuit 500 includes an inverter 502, an N-type Metal Oxide Semiconductor (NMOS) transistor 504, a P-type MOS (PMOS) transistor 506, a PMOS transistor 508, a PMOS transistor 510, a PMOS transistor 512, an NMOS transistor 514 and an inverter 516.

An input terminal of inverter 502 is configured to receive a signal CLK. Each of the input terminal of inverter 502, a gate terminal of PMOS transistor 506, and a gate terminal of NMOS transistor 504 are coupled to each other. An output terminal of inverter 502 is configured to output a signal CLKB1. In some embodiments, signal CLKB1 is an inverted version of signal CLK. Inverter 502 is configured to generate signal CLKB1 based on signal CKPI. Inverter 502 is coupled to supply voltage VDDI. In some embodiments, inverter 502 is a CMOS inverter type coupled to supply voltage VDDI and reference voltage VSS.

The gate terminal of NMOS transistor 504 is configured to receive clock signal CLK. A source terminal of NMOS transistor 504 is coupled to supply reference voltage VSS. Each of a drain terminal of NMOS transistor 504, a drain terminal of PMOS transistor 506, a gate terminal of PMOS transistor 510, and an input terminal of inverter 516 are coupled together at a node 5-N1.

The gate terminal of PMOS transistor 506 is configured to receive clock signal CLK. A source terminal of PMOS transistor 506 is coupled to the drain terminal of PMOS transistor 508.

A source terminal of PMOS transistor 508 is coupled with supply voltage VDDM. Each of a gate terminal of PMOS transistor 508, a drain terminal of NMOS transistor 514, and a drain terminal of PMOS transistor 512 are coupled to each other at a node 5-N2. The gate terminal of PMOS transistor 508 is configured to receive a voltage at node 5-N2. In some embodiments, PMOS transistor 508 is turned on or off based on the voltage at node 5-N2.

NMOS transistor 504, PMOS transistor 506 and PMOS transistor 508 are configured to set the voltage of node 5-N1 which corresponds to signal CLK_LSB. For example, in some embodiments, if NMOS transistor 504 is turned on, NMOS transistor 504 is configured to pull node 5-N1 towards reference voltage VSS. For example, in some embodiments, if PMOS transistors 506 and 508 are turned on, PMOS transistors 506 and 508 are configured to pull node 5-N1 towards supply voltage VDDM.

A source terminal of PMOS transistor 510 is coupled with supply voltage VDDM. A drain terminal of PMOS transistor 510 is coupled with a source terminal of PMOS transistor 512. The gate terminal of PMOS transistor 510 is coupled to at least node 5-N1. A voltage at node 5-N1 corresponds to a signal CLK_LSB. The gate terminal of PMOS transistor 510 is configured to receive signal CLK_LSB. In some embodiments, PMOS transistor 510 is turned on or off based on the voltage at node 5-N1 which corresponds to signal CLK_LSB.

The gate terminal of PMOS transistor 512 is configured to receive signal CLKB1 from inverter 502. Each of the gate terminal of PMOS transistor 512, a gate terminal of NMOS transistor 514 and the output terminal of inverter 502 are coupled to each other.

The gate terminal of NMOS transistor 514 is configured to receive signal CLKB1 from inverter 502. A source terminal of NMOS transistor 514 is coupled to supply reference voltage VSS.

NMOS transistor 514, PMOS transistor 510 and PMOS transistor 512 are configured to set the voltage of node 5-N1 which corresponds to signal CLK_LSB. For example, in some embodiments, if NMOS transistor 514 is turned on, NMOS transistor 514 is configured to pull node 5-N2 towards reference voltage VSS. For example, in some embodiments, if PMOS transistors 510 and 512 are turned on, PMOS transistors 510 and 512 are configured to pull node 5-N2 towards supply voltage VDDM.

The input terminal of inverter 516 is configured to receive signal CLK_LSB from node 5-N1. An output terminal of inverter 516 is configured to output signal CLK_LS. In some embodiments, signal CLK_LS is an inverted version of signal CLK_LSB. Inverter 516 is configured to generate signal CLK_LS based on signal CLK_LSB. Inverter 516 is coupled to supply voltage VDDM. In some embodiments, inverter 516 is a CMOS inverter type coupled to supply voltage VDDM and reference voltage VSS. Signal CLK_LS corresponds to the output signal of level shifter circuit 500. Signal CLK_LS is a level shifted version of signal CLK. For example, signal CLK_LS a high voltage domain clock signal that uses supply voltage VDDM, and signal CLK is a low voltage domain clock signal that uses supply voltage VDDI.

Other configurations and types of level shifters for level shifter circuit 600 are within the scope of the present disclosure.

Scrambler Circuit

Figure 6:
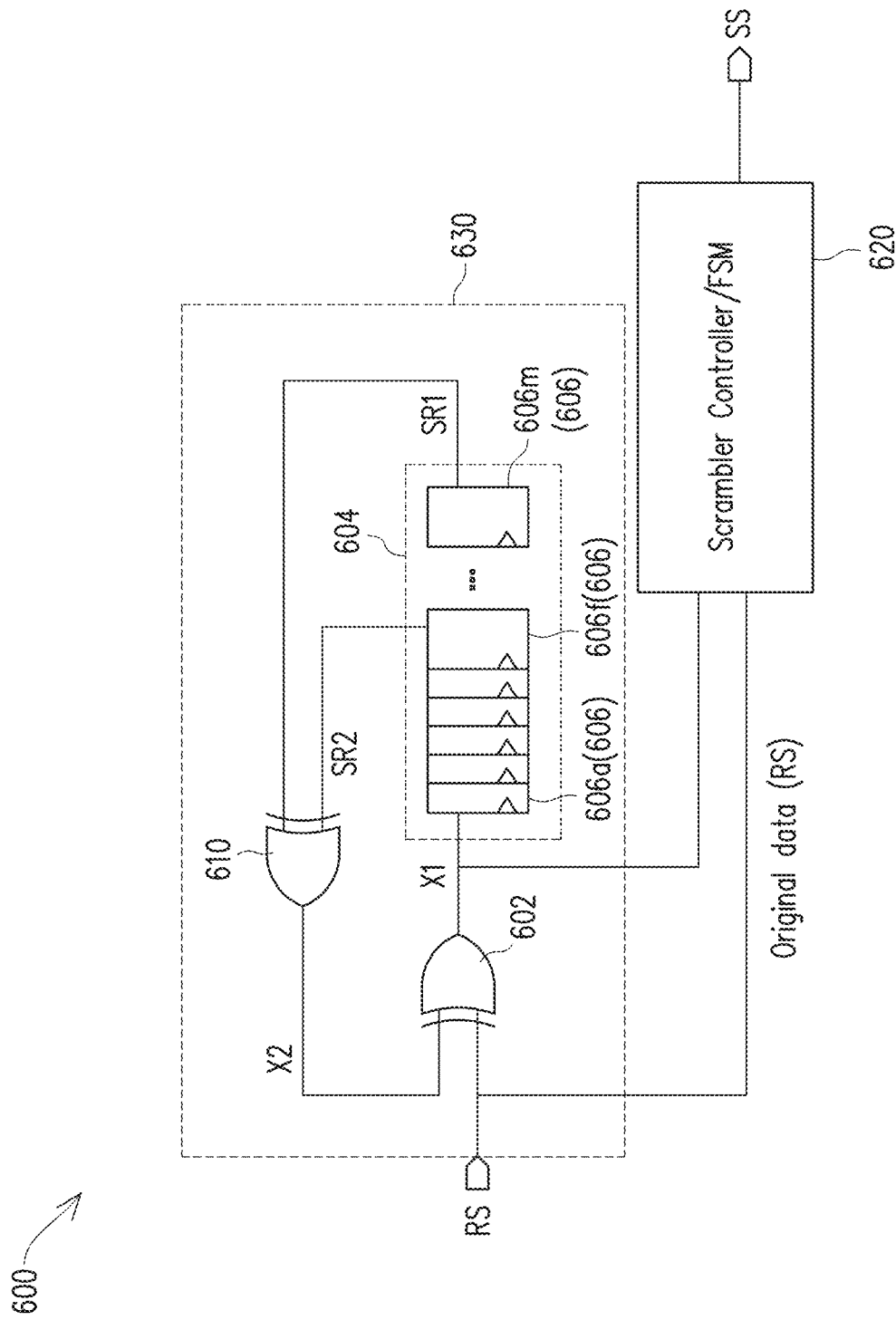
FIG. 6 is a circuit diagram of a scrambler circuit, in accordance with some embodiments.

FIG. 6 is a circuit diagram of a scrambler circuit 600, in accordance with some embodiments.

Circuit 600 is an embodiment of scrambler circuit 222 of FIGS. 2A-2B.

Circuit 600 comprises an XOR logic gate 602, a shift register 606, an XOR logic gate 610 and a scrambler controller 620. In some embodiments, XOR logic gate 602, a shift register 606, an XOR logic gate 610 are part of a linear feedback shift register (LFSR) 630. Other types of shift registers are within the scope of the present disclosure.

In some embodiments, duty cycle reference signal RS is received by circuit 600, and is combined with the output signal (e.g., second XOR output signal X2) of LFSR 630 to generate a scrambled signal X1.

The XOR logic gate 602 includes a first input terminal coupled to an output terminal of XOR logic gate 610, and configured to receive a second XOR output signal X2. The XOR logic gate 602 further includes a second input terminal configured to receive duty cycle reference signal RS. In some embodiments, the second input terminal of XOR logic gate 602 is coupled to reference generator circuit 220. The XOR logic gate 602 further includes an output terminal coupled to flip-flop 606a, and configured to output a first XOR output signal X1.

Shift register 604 includes one or more flip-flops 606a, . . . , 606f, . . . , 606l or 606m (collectively hereinafter referred to as "a set of flip-flops 606"). Other numbers of flip-flops in the set of flip-flops 606 are within the scope of the present disclosure. Other types of flip-flops of the set of flip-flops 606 in shift register 604 is within the scope of the present disclosure. Shift register 604 is configured to receive the scrambled signal X1, and to generate an output shift register signal SR1 and an output shift register signal SR2.

The XOR logic gate 610 includes a first input terminal coupled to an output terminal of shift register 606m, and configured to receive the output shift register signal SR1. The XOR logic gate 610 further includes a second input terminal coupled to an output terminal of shift register 606f, and configured to receive the output shift register signal SR1. The XOR logic gate 610 further includes an output terminal coupled to the first input terminal of XOR logic gate 602, and configured to output the second XOR output signal X2.

Scrambler controller 620 is coupled to the output terminal of XOR logic gate 602, and is configured to receive scrambled signal X1. Scrambler controller 620 is also configured to receive duty cycle reference signal RS. In some embodiments, scrambler controller 620 is coupled to the programmable duty reference generator circuit 220 and filter 224 of FIGS. 2A-2B.

Scrambler controller 620 is configured to generate the scrambled duty cycle signal SS responsive to the duty cycle reference signal RS and the scrambled signal X1. In some embodiments, duty cycle reference signal RS of FIG. 6 is duty cycle reference signal RS of FIGS. 2A-2B, and similar detailed description is therefore omitted. In some embodiments, scrambled duty cycle signal SS of FIG. 6 is scrambled duty cycle signal SS of FIGS. 2A-2B, and similar detailed description is therefore omitted.

In some embodiments, scrambler controller 620 is a scrambler finite state machine (FSM). In some embodiments, scrambler controller 620 corresponds to a programmable logic device, a programmable logic controller, one or more logic gates, one or more flip-flops, one or more relay devices or the like.

Scrambler controller 620 is configured to review duty cycle reference signal RS for each period, and to replace logic 1s in the duty cycle reference signal RS with logic 0s once the maximum number of logic 1s in duty cycle reference signal RS is reached for the remaining portion of the period. For example, in some embodiments, for a duty cycle reference signal RS being "0000000011" for a binary string of 10 (Y=10) numbers in one period, the duty cycle is 20% and there are 2 logic 1s in the duty cycle reference signal RS for one period.

For example, in these embodiments, for a duty cycle reference signal RS being "0000000011", LFSR 630 generates a scrambled signal X1 as "01001001010001 . . . ", and scrambler controller 620 receives each signal X1 and RS. In these embodiments, scrambler controller 620 looks at duty cycle reference signal RS and scrambled signal X1 bit by bit, and counts the number of logic 1s in the duty cycle reference signal RS. In these embodiments, when the scrambler controller 620 reaches the $8^{th}$ entry of scrambled signal X1, "01001001010001", which is a logic 1, scrambler controller 620 replaces the logic 1 and pads the remaining portion of scrambled signal X1 with logic 0s, as shown by "0100100000" being the scrambled duty cycle signal SS. In other words, in some embodiments, scrambler controller 620 reviews scrambled signal X1 in 1 period, and once the maximum number of logic 1s is reached in scrambled signal X1 for the one period, scrambler controller 620 pads the remaining binary string for scrambled duty cycle signal SS signal with logic 0s.

Other arrangements or types of data for duty cycle reference signal RS or scrambled signal SS are within the scope of the present disclosure.

In some embodiments, by rearranging the series of logic 1s and 0s, the frequency of the scrambled signal SS is increased compared with the frequency of the duty cycle reference signal RS, but the duty cycle of the scrambled signal SS and the duty cycle of the reference signal RS is the same.

In some embodiments, by rearranging the series of logic 1s and 0s, the frequency of the scrambled signal SS is increased compared with the frequency of the reference signal RS, but the duty cycle of the scrambled signal SS and the duty cycle of the reference signal RS is the same.

In some embodiments, scrambler circuit 620 increases the frequency of the scrambled signal SS which results in filter 224 being utilized for signals having higher frequencies, and therefore occupies less area than filters utilized with signals having lower frequencies.

In some embodiments, scrambler circuit 620 is configured to reduce the differences between the filtered scrambled duty cycle signal FS1 and the filtered first clock output signal FS2 which makes the filtered scrambled duty cycle signal FS1 more accurate for comparator 228 and reduces calibration time. For example, in some embodiments, if the filtered scrambled duty cycle signal FS1 differs from the filtered first clock output signal FS2 by a larger amount, then the calibration of the duty cycle adjustment circuit 206 would increase. In some embodiments, by reducing the differences between the filtered scrambled duty cycle signal FS1 and the filtered first clock output signal FS2, scrambler circuit 222 reduces the calibration time of duty cycle adjustment circuit 206.

Other configurations and types of scrambler circuits 620 are within the scope of the present disclosure.

Waveforms

Figure 7A:
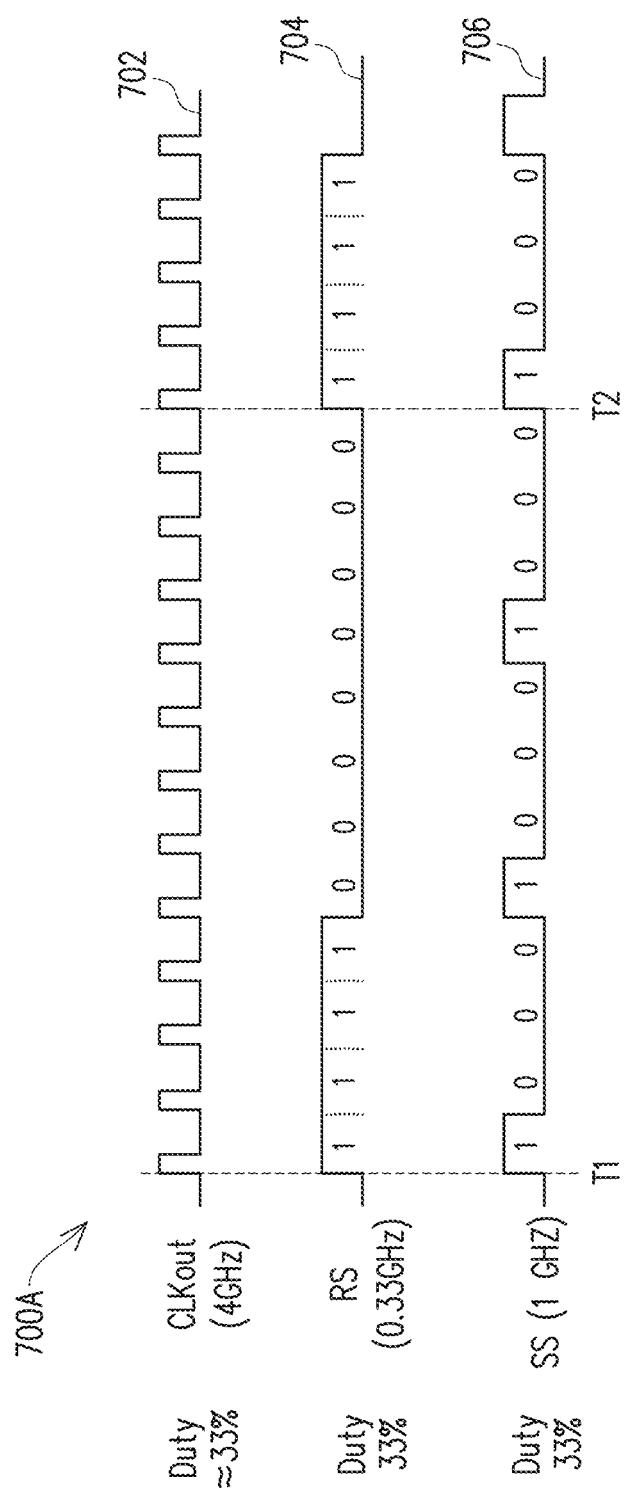
FIG. 7A is a graph of waveforms of a circuit, in accordance with some embodiments.

FIG. 7A is a graph of waveforms 700A of a circuit, such as circuit 200A in FIG. 2A or 200B in FIG. 2B, in accordance with some embodiments.

Waveforms 700A include waveforms of signals generated by edge triggered flip-flop 214, programmable duty reference generator circuit 220 and scrambler circuit 222 or 620.

In some embodiments, curve 702 represents the first clock output signal CLKout output by the edge triggered flip-flop 214 of FIGS. 1 & 2A-2C; curve 704 represents the duty cycle reference signal RS output by the output terminal of programmable duty reference generator circuit 220; and curve 706 represents scrambled signal SS output by an output terminal of scrambler circuit 222 or 620.

In this illustration, curve 702 has a frequency of 4 GHZ and a duty cycle of 33%, curve 704 has a frequency of 0.33 GHZ and a 33% duty cycle and curve 706 has a frequency of 1 GHZ and a duty cycle of 33%.

As shown in FIG. 7A, the time between time T1 and T2 is one period for first clock output signal CLKout.

Curve 702 transitions from a high logical value to a low logical value or from a low logical value to a high logical value in the one period twelve times.

For an input duty cycle DCin being equal to 33%, curve 704 (e.g., signal RS), generated by the programmable reference generator circuit 220, is "111100000000" for a binary string of 12 (Y=12) numbers. In this example, the binary string of 12 numbers includes four logic 1s and eight logic 0s, and the number of logic 1s divided by the length of the binary string Y (e.g., 4/12) corresponds to the input duty cycle of 33%.

Curve 706 (e.g., signal SS) is "100010001000" for a binary string of 12 (Y=12) numbers for curve 704 being "111100000000".

In some embodiments, by rearranging the series of logic 1s and 0s, scrambled signal SS has a frequency of 1 GHz that is increased compared with the frequency of 0.33 GHz for the duty cycle reference signal RS, but the duty cycle of the scrambled signal SS and the duty cycle of the reference signal RS is the same. In some embodiments, scramble circuit 222 or 620 is configured to up convert the frequency of the scrambled signal SS. In some embodiments, by up converting the frequency of scrambled signal SS results in filter 224 being utilized for signals of higher frequencies and therefore occupies less area than filters utilized for signals of lower frequencies.

Other arrangements or types of data for scrambled signal SS and reference signal RS are within the scope of the present disclosure.

Figure 7B:
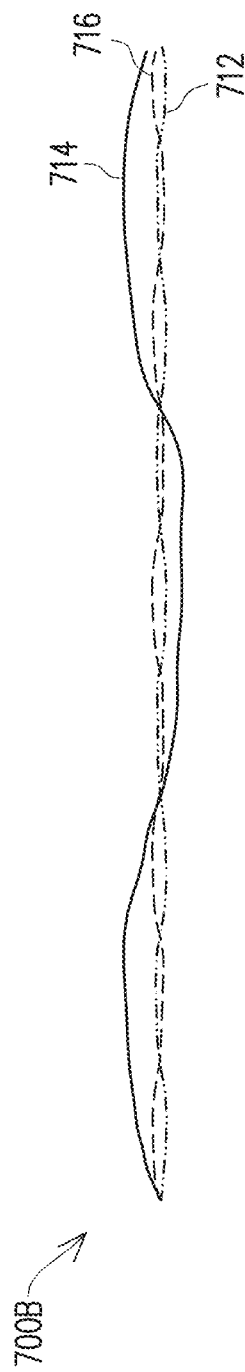
FIG. 7B is a graph of waveforms of a circuit, in accordance with some embodiments.

FIG. 7B is a graph of waveforms 700B of a circuit, such as circuit 200A in FIG. 2A or 200B in FIG. 2B, in accordance with some embodiments.

Waveforms 700B include filtered versions of the waveforms 700A of FIG. 7A. For example, waveforms 700B are filtered versions of the signals generated by edge triggered flip-flop 214, programmable duty reference generator circuit 220 and scrambler circuit 222 or 620.

In some embodiments, curve 712 represents the filtered first clock output signal FS2 output by filter 220 of FIGS. 1 & 2A-2C; curve 714 represents a filtered version of the duty cycle reference signal RS; and curve 716 represents filtered scrambled duty cycle signal FS1 and output by an output terminal of filter 226.

In some embodiments, controller 230 is configured to adjust duty cycle adjustment circuit 206 based on the comparison of signals received (e.g., FS1 and FS2) by comparator 228. Thus, in some embodiments, if a difference between signals received (e.g., FS1 and FS2) by comparator 228 is decreased, then a calibration time of circuit 200A or 200B is decreased. Conversely, in some embodiments, if a difference between signals received (e.g., FS1 and FS2) by comparator 228 is increased, then a calibration time of circuit 200A or 200B is increased.

In some embodiments, a difference between curve 712 (e.g., filtered scrambled duty cycle signal FS1) and curve 716 (e.g., filtered first clock output signal FS2) is less than a difference between curve 712 (e.g., filtered scrambled duty cycle signal FS1) and curve 714 (e.g., filtered version of the duty cycle reference signal RS) which reduces the calibration time of circuit 200A or 200B.

Finite State Machine State Diagram

FIG. 8 is a diagram 800 of a state transition of a circuit, such as controller 230 in FIG. 2A or 200B in FIG. 2B, in accordance with some embodiments.

In some embodiments, diagram 800 is a state transition diagram of controller 230.

Diagram 800 includes a state 802, a state 804, a state 806, a state 808 and a state 810.

State 802 corresponds to an initialization ("INIT") state of controller 230. In some embodiments, the initialization state corresponds to initializing various parameters of the controller 230. In some embodiments, the initialization state corresponds to resetting various parameters of the controller 230. In some embodiments, the parameters of controller 230 include one or more of set of control signals CS, calibration flag signal CAL, select control signal SEL or comparison signal CPS. In some embodiments, state 802 is entered from one of the other states in diagram 800 when a reset signal RST has a value of logic 1. In some embodiments, state 802 transitions to state 804 when the reset signal RST has a value of logic 0.

State 804 corresponds to an idle state of controller 230. In some embodiments, the idle state corresponds to the controller 230 waiting for an update from one of the parameters. In some embodiments, state 804 can transition to state 806. In some embodiments, state 804 transitions to state 806 when the calibration flag signal CAL has a value of logic 1. In some embodiments state 804 can transition to state 802.

State 806 corresponds to a calibration state of controller 230. In some embodiments, the calibration state of controller 230 includes calibrating or adjusting the duty cycle DC2 of the first clock output signal CLKout. In some embodiments, the calibration state of controller 230 includes calibrating or adjusting the duty cycle adjustment circuit 206. In some embodiments, state 806 transitions to state 804, state 808 or state 810.

In some embodiments, state 806 transitions to state 808 to increase the duty cycle DC2 of the first output clock signal CLKout. In some embodiments, state 806 transitions to state 808 when comparison signal CPS has a value of logic 0.

In some embodiments, state 806 transitions to state 810 to decrease the duty cycle DC2 of the first output clock signal CLKout. In some embodiments, state 806 transitions to state 810 when comparison signal CPS has a value of logic 1.

In some embodiments, when calibration is completed, controller 230 is configured to change the value of calibration flag signal CAL to a value of logic 0. For example, in some embodiments, if the calibration flag signal CAL has a value of logic 0, state 806 transitions to state 804. In some embodiments, calibration is completed when the duty cycle DC2 of the first clock output signal CLKout is similar to the input duty cycle DCin, and state 806 is configured to transition to state 804. For example, in some embodiments, in the calibration state (state 806), after a number of state transitions Z (e.g., after a series of alternating logic 1 or 0 and logic 0 or 1 values for the comparison signal CPS), controller 230 determines that calibration is complete, and the calibration flag signal CAL is changed to a value of logic 0, and state 806 transitions to state 804. In some embodiments, the number of state transitions Z ranges from about 2 transitions to about 100 transitions. In some embodiments, if the number of state transitions Z is less than 2, than controller 230 may not have enough data points to reach a steady-state and the calibration is incomplete and therefore not accurate. In some embodiments, if the number of state transitions Z is greater than 100, than the time for controller 230 to reach a steady-state may be too large and the calibration time will also take too long.

State 808 corresponds to an increase of the duty cycle of the duty cycle adjustment circuit 206. In some embodiments, in state 808, controller 230 is configured to increase the duty cycle DC2 of the first output clock signal CLKout. In some embodiments, controller 230 is configured to increase the duty cycle DC2 of the first output clock signal CLKout by adjusting at least the set of control signals CS or adjusting the select control signal SEL. Afterwards, state 808 transitions back to state 806, where controller 230 awaits the next value of comparison signal CPS.

State 810 corresponds to a decrease of the duty cycle of the duty cycle adjustment circuit 206. In some embodiments, in state 810, controller 230 is configured to decrease the duty cycle DC2 of the first output clock signal CLKout. In some embodiments, controller 230 is configured to decrease the duty cycle DC2 of the first output clock signal CLKout by adjusting at least the set of control signals CS or adjusting the select control signal SEL. Afterwards, state 810 transitions back to state 806, where controller 230 awaits the next value of comparison signal CPS.

Other values for at least reset signal RST, calibration flag signal CAL or comparison signal CPS in diagram 800 are within the scope of the present disclosure. Other states or state transitions in diagram 800 are within the scope of the present disclosure.

Method

Figure 9:
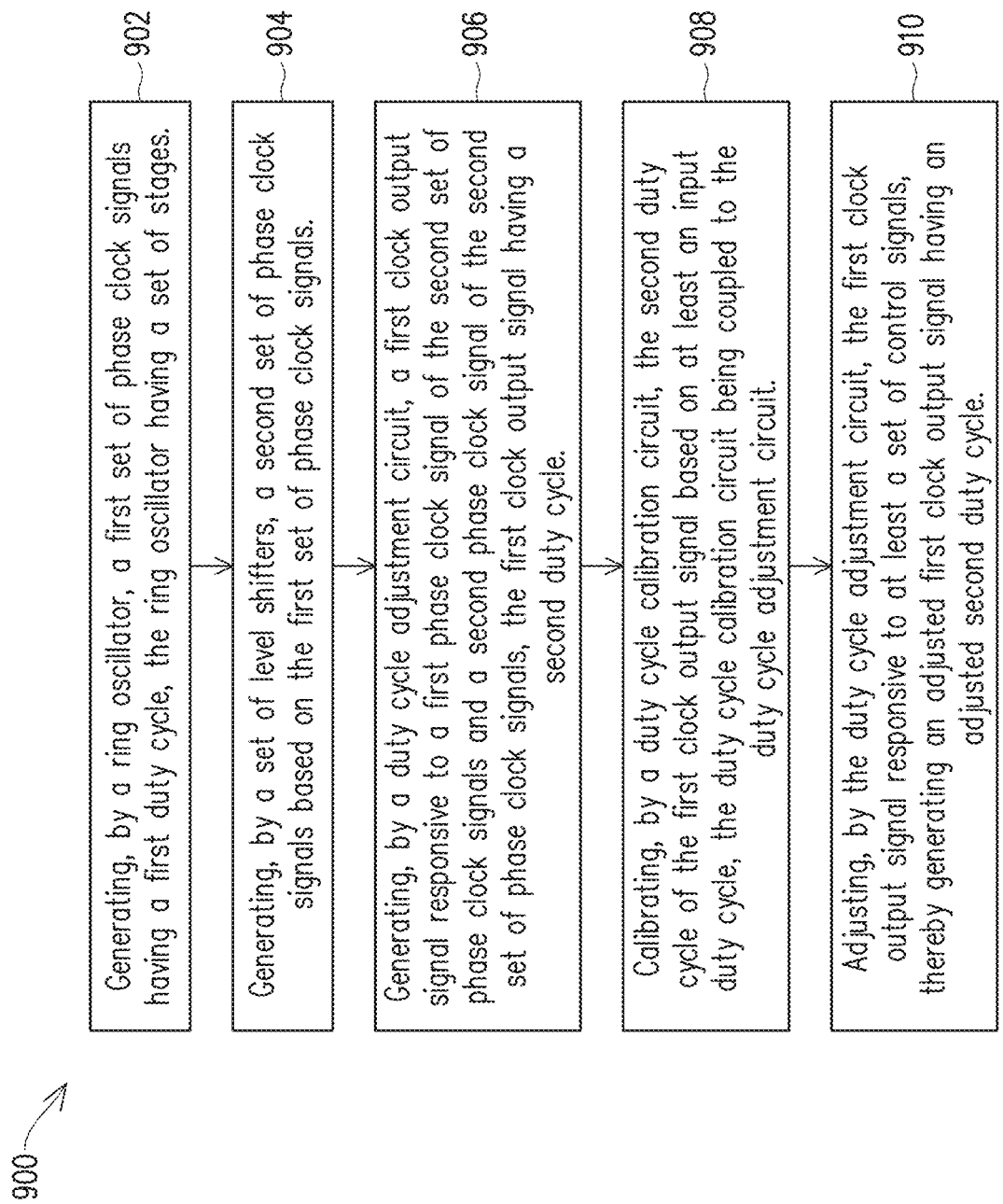
FIG. 9 is a flowchart of a method of operating a circuit, in accordance with some embodiments.

FIG. 9 is a flowchart of a method of operating a circuit, such as the circuit of FIGS. 1, 2A-2C or FIGS. 5-6, in accordance with some embodiments. It is understood that additional operations may be performed before, during, and/or after the method 900 depicted in FIG. 9, and that some other processes may only be briefly described herein. It is understood that method 900 utilizes features of one or more of circuit 100 of FIG. 1, circuits 200A-200C of corresponding FIGS. 2A-2C or circuits 500-600 of corresponding FIGS. 5-6.

In operation 902 of method 900, a first set of phase clock signals CLK1 or CLK1' are generated by a ring oscillator. In some embodiments the ring oscillator of method 900 includes at least clock generating circuit 102 or ring oscillator 202 or 202'. In some embodiments the first set of phase clock signals CLK1 or CLK1' has a first duty cycle DCL.

In operation 904 of method 900, a second set of phase clock signals CLK2 are generated based on the first set of phase clock signals CLK1 or CLK1'. In some embodiments, in operation 904, the second set of phase clock signals CLK2 are generated by a set of level shifters. In some embodiments, the set of level shifters of method 900 includes at least level shifter circuit 104, 204 or 204'. In some embodiments, each phase clock signal of the second set of phase clock signals CLK2 is generated responsive to a corresponding phase clock signal of the first set of phase clock signals CLK1 or CLK1'.

In operation 906 of method 900, a first clock output signal CLKout is generated responsive to a first phase clock signal of the second set of phase clock signals and the second phase clock signal CLKpm of the second set of phase clock signals. In some embodiments, the first phase clock signal of the second set of phase clock signals of method 900 includes first phase clock signal CLKp1 or the adjusted first phase clock signal CLKp1'. In some embodiments, the first clock output signal CLKout has a second duty cycle DC2. In some embodiments, the first clock output signal CLKout is generated by a duty cycle adjustment circuit. In some embodiments, the duty cycle adjustment circuit of method 900 includes at least the duty cycle adjustment circuit 106 or 206. In some embodiments, for method 900, the first clock output signal includes an adjusted first clock output signal responsive to the adjusted first phase clock signal CLKp1'.

In some embodiments, operation 906 further comprises at least operation 906a, 906b or 906c (not shown).

In operation 906a of method 900, the first phase clock signal of the second set of phase clock signals CLK2 is received as a first input to an edge triggered circuit. In some embodiments, the edge triggered circuit of method 900 is the edge triggered flip-flop 214. In some embodiments, the first input to the edge triggered circuit corresponds to an input terminal of NOR logic gate NOR1.

In operation 906b of method 900, the second phase clock signal CLKpm of the second set of phase clock signals is selected, by a multiplexer 210, as a second input to the edge triggered circuit 214. In some embodiments, the second input to the edge triggered circuit corresponds to an input terminal of NOR logic gate NOR2.

In operation 906c of method 900, the second phase clock signal CLKpm of the second set of phase clock signals is received as the second input to the edge triggered circuit.

In operation 908 of method 900, the second duty cycle DC2 of the first clock output signal CLKout is calibrated based on at least an input duty cycle DCin. In some embodiments, for method 900, the second duty cycle DC2 is calibrated by a duty cycle calibration circuit. In some embodiments, the duty cycle calibration circuit of method 900 includes duty cycle calibration circuit 108 or 208.

In some embodiments, operation 908 further comprises at least operation 908a, 908b, 908c, 908d, 908e, 908f or 908g (not shown).

In operation 908a of method 900, the input duty cycle DCin is received. In some embodiments the input duty cycle DCin is received from a user.

In operation 908b of method 900, a duty cycle reference signal RS is generated, by a programmable duty reference generator circuit 220, responsive to the input duty cycle DCin.

In operation 908c of method 900, a scrambled duty cycle signal is generated, by a scrambler circuit, responsive to the duty cycle reference signal RS. In some embodiments, the scrambled duty cycle signal of method 900 includes scrambled signal SS. In some embodiments, the scrambler circuit of method 900 includes scrambler circuit 222 or 600.

In operation 908d of method 900, a filtered scrambled duty cycle signal FS1 is generated, by a first filter, responsive to the scrambled duty cycle signal. In some embodiments, the first filter of method 900 includes filter 224.

In operation 908e of method 900, a filtered first clock output signal FS2 is generated, by a second filter, responsive to the first clock output signal CLKout or the adjusted first clock output signal. In some embodiments, the second filter of method 900 includes filter 226.

In operation 908f of method 900, a comparison signal CPS is generated, by a comparator 228, based on a comparison of the filtered scrambled duty cycle signal FS1 and the filtered first clock output signal FS2.

In operation 908g of method 900, the set of control signals CS is generated, by a controller 230, responsive to the comparison signal CPS.

In operation 910 of method 900, the first clock output signal CLKout is adjusted responsive to at least a set of control signals CS. In some embodiments, for operation 910, the first clock output signal is adjusted by the duty cycle adjustment circuit. In some embodiments, for operation 910, adjusting the first clock output signal CLKout thereby generates an adjusted first clock output signal having an adjusted second duty cycle. In some embodiments, the adjusted first clock output signal includes the first clock output signal CLKout. In some embodiments the adjusted second duty cycle includes the second duty cycle DC2. In some embodiments, operation 910 corresponds to performing a fine tuning of the duty cycle DC2 of the first clock output signal CLKout.

In some embodiments, operation 910 further comprises at least operation 910a, 910b, 910c, 910d or 910e (not shown).

In operation 910a of method 900, the first phase clock signal of the second set of phase clock signals CLK2 is adjusted responsive to at least the set of control signals CS, thereby generating an adjusted first phase clock signal CLKp1' of the second set of phase clock signals CKL2. In some embodiments, for operation 910a, the first phase clock of the second set of phase clocks CLK2 is adjusted by the duty cycle adjustment circuit.

In operation 910b of method 900, the adjusted first phase clock signal of the second set of phase clock signals is received as a first input to the edge triggered circuit.

In operation 910c of method 900, the second phase clock signal CLKpm of the second set of phase clock signals is selected, by the multiplexer 210, as a second input to the edge triggered circuit. In some embodiments the second phase clock signal CLKpm of the second set of phase clock signals CLK2 is selected by multiplexer 210 in response to the select control signal SEL. In some embodiments, operation 910 corresponds to performing a coarse tuning of the duty cycle DC2 of the first clock output signal CLKout.

In operation 910d of method 900, the second phase clock signal CLKpm of the second set of phase clock signals CLK2 is received as the second input to the edge triggered circuit.

In operation 910e of method 900, the adjusted first clock output signal is generated, by the edge triggered circuit, responsive to the adjusted first phase clock signal CLKp1' of the second set of phase clock signals CLK2 and the second phase clock signal CLKpm of the second set of phase clock signals CLK2.

In some embodiments, one or more of the operations of method 900 is not performed. While method 900 was described above with reference to FIGS. 1, 2A-2C, it is understood that method 900 utilizes the features of one or more of FIGS. 3-9. In some these embodiments, other operations of method 900 would be performed consistent with the description and operation of circuits 300-900 of FIGS. 3-9.

Embodiments of the disclosure are not limited to a particular low logical value or high logical value of various signals used in the above description is also for illustration. Embodiments of the disclosure are not limited to a particular logical value when a signal is activated and/or deactivated. Selecting different logical values is within the scope of various embodiments. Selecting different numbers of stages in ring oscillator 202 or 202' is within the scope of various embodiments. Selecting different numbers of level shifters in level shifter circuit 204 or 204' is within the scope of various embodiments. Selecting different numbers of inverters in ring oscillator 204 or 204' is within the scope of various embodiments.

FIG. 10 is a schematic view of a controller 1000 usable in one or more of the duty cycle adjustment circuit 106 of FIG. 1, the calibration circuit 108 of FIG. 1, the duty cycle adjustment circuit 206 of FIGS. 2A-2B or the calibration circuit 208 of FIGS. 2A-2B, in accordance with some embodiments.

In some embodiments, controller 1000 is useable as one or more of the programmable duty reference generator circuit 220 of FIGS. 2A-2B, the scrambler circuit 222 of FIGS. 2A-2B, or the scrambler circuit 600 of FIG. 6. In some embodiments, controller 1000 is an embodiment of controller 230 shown in FIGS. 2A-2B). In some embodiments, controller 1000 is an embodiment of controller 620 shown in FIG. 6). In some embodiments, the controller 1000 is a computing device which implements at least a portion of state diagram 800 of FIG. 8 or method 900 of FIG. 9 in accordance with one or more embodiments.

Controller 1000 includes a hardware processor 1002 and a non-transitory, computer readable storage medium 1004 encoded with, i.e., storing, the computer program code 1006, i.e., a set of executable instructions. Computer readable storage medium 1004 is also encoded with instructions for interfacing with at least one or more of duty cycle adjustment circuit 206, programmable duty reference generator circuit 220, scrambler circuit 222 or 600 or comparator 228. The processor 1002 is electrically coupled to the computer readable storage medium 1004 by a bus 1008. The processor 1002 is also electrically coupled to an I/O interface 1010 by bus 1008. A network interface 1012 is also electrically connected to the processor 1002 by bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause controller 1000 to be usable for performing a portion or all of the operations as described in state diagram 800 or method 900.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause controller 1000 to perform state diagram 800 or method 900. In some embodiments, the storage medium 1004 also stores information needed for performing state diagram 800 or method 900 as well as information generated during performance of state diagram 800 or method 900, such as reference signal 1016, scrambled signal 1018, clock output signal 1020, duty cycle signals 1022, comparator output signal 1024, set of control signals 1026, selection signal 1028 or FSM signals 1030, and/or a set of executable instructions to perform the operation of state diagram 800 or method 900.

In some embodiments, the storage medium 1004 stores instructions (e.g., computer program code 1006) for interfacing with one or more of duty cycle adjustment circuit 206, programmable duty reference generator circuit 220, scrambler circuit 222 or 600 or comparator 228. The instructions (e.g., computer program code 1006) enable processor 1002 to generate instructions readable by the one or more of duty cycle adjustment circuit 206, programmable duty reference generator circuit 220, scrambler circuit 222 or 600 or comparator 228 to effectively implement state diagram 800 or method 900.

Controller 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

Controller 1000 also includes network interface 1012 coupled to the processor 1002. Network interface 1012 allows Controller 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-13104. In some embodiments, state diagram 800 or method 900 is implemented in two or more systems 1000, and information such as reference signal, scrambled signal, clock output signal, duty cycle signals, comparator output signal, set of control signals, selection signal or FSM signals are exchanged between different systems 1000 by network 1014.

Controller 1000 is configured to receive information related to a reference signal through I/O interface 1010 or network interface 1012. The information is transferred to processor 1002 by bus 1008 to generate a reference signal. The reference signal is then stored in computer readable medium 1004 as reference signal 1016. Controller 1000 is configured to receive information related to a scrambled signal through I/O interface 1010 or network interface 1012. The information is stored in computer readable medium 1004 as scrambled signal 1018. Controller 1000 is configured to receive information related to a clock output signal through I/O interface 1010 or network interface 1012. The information is stored in computer readable medium 1004 as clock output signal 1020. Controller 1000 is configured to receive information related to duty cycle signals through I/O interface 1010 or network interface 1012. The information is stored in computer readable medium 1004 as duty cycle signals 1022. Controller 1000 is configured to receive information related to a comparator output signal through I/O interface 1010 or network interface 1012. The information is stored in computer readable medium 1004 as comparator output signal 1024. Controller 1000 is configured to receive information related to a set of control signals through I/O interface 1010 or network interface 1012. The information is stored in computer readable medium 1004 as set of control signals 1026. Controller 1000 is configured to receive information related to a selection signal through I/O interface 1010 or network interface 1012. The information is stored in computer readable medium 1004 as selection signal 1028. Controller 1000 is configured to receive information related to FSM signals through I/O interface 1010 or network interface 1012. The information is stored in computer readable medium 1004 as FSM signals 1030.

In some embodiments, reference signal 1016 includes duty cycle reference signal RS. In some embodiments, scrambled signal 1018 includes scrambled signal SS or X1. In some embodiments, clock output signal includes first clock output signal CLKout. In some embodiments, duty cycle signals include at least duty cycle DC1, duty cycle DC2 or input duty cycle DCin. In some embodiments comparator output signal includes comparison signal CPS. In some embodiments, set of control signals 1026 includes set of control signals CS. In some embodiments, selection signal 1028 includes select control signal SEL. In some embodiments, FSM signals include at least reset signal RST, calibration flag signal CAL, comparison signal CPS, scrambled signal X1 or second XOR output signal X2.

In some embodiments, at least portions of state diagram 800 or method 900 is implemented as a standalone software application for execution by a processor. In some embodiments, at least portions of state diagram 800 or method 900 is implemented as a software application that is a part of an additional software application. In some embodiments, at least portions of state diagram 800 or method 900 is implemented as a plug-in to a software application.

One aspect of this description relates to a clock circuit. The clock circuit includes a set of level shifters, a duty cycle adjustment circuit and a calibration circuit. In some embodiments, the set of level shifters is configured to output a first set of phase clock signals having a first duty cycle, each level shifter of the set of level shifters being configured to output a corresponding phase clock signal of the first set of phase clock signals. In some embodiments, the duty cycle adjustment circuit configured to generate a first clock output signal responsive to at least one of a first phase clock signal of the first set of phase clock signals, a second phase clock signal of the first set of phase clock signals or a set of control signals, the first clock output signal having a second duty cycle different from the first duty cycle. In some embodiments, the calibration circuit is coupled to the duty cycle adjustment circuit, and configured to perform a duty cycle calibration of the second duty cycle of the first clock output signal based on an input duty cycle, and to generate the set of control signals responsive to the duty cycle calibration of the second duty cycle. In some embodiments, the clock circuit further includes a clock generating circuit coupled to the set of level shifters. In some embodiments, the clock generating circuit has a set of stages, and is configured to generate a second set of phase clock signals having the first duty cycle. In some embodiments, each stage of the set of stages of the clock circuit is configured to output a corresponding phase clock signal of the second set of phase clock signals to a corresponding level shifter of the set of level shifters. In some embodiments, each level shifter is configured to output the corresponding phase clock signal of the first set of phase clock signals based on the corresponding phase clock signal of the second set of phase clock signals. In some embodiments, the clock generating circuit includes a ring oscillator. In some embodiments, the adjustment circuit includes an adjustable delay circuit, a multiplexer, and a flip-flop. In some embodiments, the adjustable delay circuit is coupled to a first level shifter of the set of level shifters, and is configured to output an adjusted first phase clock signal or the first phase clock signal of the first set of phase clock signals responsive to the first phase clock signal of the first set of phase clock signals and the set of control signals. In some embodiments, the multiplexer is coupled to at least a second level shifter of the set of level shifters, and is configured to receive a select control signal and at least a phase clock signal of the first set of phase clock signals, and is configured to output the second phase clock signal of the first set of phase clock signals. In some embodiments, the flip-flop is coupled to the multiplexer and the adjustable delay circuit, and is configured to output the first clock output signal responsive to the adjusted first phase clock signal or the first phase clock signal of the first set of phase clock signals, and the second phase clock signal of the first set of phase clock signals. In some embodiments, the flip-flop includes an edge-triggered flip-flop. In some embodiments, the edge-triggered flip-flop includes a first NOR logic gate and a second NOR logic gate. In some embodiments, the first NOR logic gate has a first output terminal configured to output the first clock output signal and is coupled to the calibration circuit, a first input terminal coupled to the multiplexer, and a second input terminal. In some embodiments, the second NOR logic gate has a first output terminal configured to output an inverted first clock output signal and coupled to the second input terminal of the first NOR logic gate, a first input terminal coupled to the adjustable delay circuit, and a second input terminal coupled to the first output terminal of the first NOR logic gate. In some embodiments, the calibration circuit includes a programmable duty reference generator circuit, a scrambler circuit, a first filter, a second filter, a comparator and a controller. In some embodiments, the programmable duty reference generator circuit is configured to receive the input duty cycle, and to generate a duty cycle reference signal responsive to the input duty cycle. In some embodiments, the scrambler circuit is coupled to the programmable duty reference generator circuit, and is configured to generate a scrambled duty cycle signal responsive to the duty cycle reference signal. In some embodiments, the first filter is coupled to the scrambler circuit, and is configured to generate a filtered scrambled duty cycle signal responsive to the scrambled duty cycle signal. In some embodiments, the second filter is coupled to the flip-flop, and is configured to generate a filtered first clock output signal responsive to the first clock output signal. In some embodiments, the comparator is coupled to the first filter and the second filter, and is configured to generate a comparison signal based on a comparison of the filtered scrambled duty cycle signal and the filtered first clock output signal. In some embodiments, the controller is coupled to the comparator and the delay adjustment circuit, and is configured to generate the set of control signals responsive to the comparison signal. In some embodiments, at least the first filter or the second filter includes a low pass filter.

Another aspect of this description relates to a clock duty cycle adjustment and calibration circuit. The clock duty cycle adjustment and calibration circuit includes a clock circuit, a set of level shifters, a duty cycle adjustment circuit and a duty cycle calibration circuit. In some embodiments, the clock circuit has a set of stages, the clock circuit configured to generate a first set of phase clock signals having a first duty cycle. In some embodiments, the set of level shifters is configured to output a second set of phase clock signals, each level shifter of the set of level shifters being coupled to a corresponding stage of the set of stages of the clock circuit, each level shifter of the set of level shifters configured to output a corresponding phase clock signal of the second set of phase clock signals based on a corresponding phase clock signal of the first set of phase clock signals. In some embodiments, the duty cycle adjustment circuit configured to generate a first clock output signal responsive to at least one of a first phase clock signal of the second set of phase clock signals, a second phase clock signal of the second set of phase clock signals or a set of control signals, the first clock output signal having a duty cycle. In some embodiments, the duty cycle calibration circuit is configured to perform a calibration of the duty cycle of the first clock output signal based on an input duty cycle, and to generate the set of control signals responsive to the calibration of the duty cycle of the first clock output signal. In some embodiments, a ring oscillator includes a first set of inverters, a second set of inverters, and a set of buffers. In some embodiments, the first set of inverters is coupled to each other in a ring. In some embodiments, an output terminal of a first inverter on a first end is coupled to an input terminal of a second inverter on an opposite end from the first end. In some embodiments, each inverter of the first set of inverters corresponds to a stage of the set of stages, and a number of stages of the set of stages is odd. In some embodiments, each inverter of the second set of inverters is coupled to a corresponding pair of inverters of the first set of inverters and a corresponding level shifter of the set of level shifters. In some embodiments, each buffer of the set of buffers is coupled to another corresponding pair of inverters of the first set of inverters and another corresponding level shifter of the set of level shifters. In some embodiments, the ring oscillator includes a differential ring oscillator and a first set of inverters. In some embodiments, the differential ring oscillator has an even number of stages of the set of stages. In some embodiments, each inverter of the first set of inverters is coupled to a corresponding stage of the set of stages of the ring oscillator and a corresponding level shifter of the set of level shifters. In some embodiments, the differential ring oscillator includes a second set of inverters, a third set of inverters and a set of latches. In some embodiments, the second set of inverters are in a first path having a first end and a second end opposite from the first end. In some embodiments, each inverter of the second set of inverters corresponds to the stage of the set of stages. In some embodiments, the third set of inverters are in a second path having a third end and a fourth end opposite from the third end, the second end is coupled to the third end, and the fourth end is coupled to the first end. In some embodiments, each inverter of the third set of inverters corresponds to the stage of the set of stages. In some embodiments, each latch of the set of latches is coupled between the first path and the second path. In some embodiments, each latch of the set of latches corresponds to the stage of the set of stages. In some embodiments, the duty cycle adjustment circuit includes a multiplexer, an adjustable delay circuit and an edge-triggered flip-flop. In some embodiments, the multiplexer is coupled to a sub-set of level shifters of the set of level shifters. In some embodiments, the multiplexer is configured to receive a select control signal and a sub-set of phase clock signals of the second set of phase clock signals from a corresponding sub-set of level shifters of the set of level shifters, and is configured to output the second phase clock signal of the second set of phase clock signals. In some embodiments, the adjustable delay circuit is coupled to a first level shifter of the set of level shifters, and is configured to output an adjusted first phase clock signal or the first phase clock signal of the second set of phase clock signals responsive to the first phase clock signal of the second set of phase clock signals and the set of control signals. In some embodiments, the edge triggered flip-flop is coupled to the multiplexer and the adjustable delay circuit, and is configured to output the first clock output signal responsive to the adjusted first phase clock signal or the first phase clock signal of the second set of phase clock signals, and the second phase clock signal of the second set of phase clock signals. In some embodiments, the edge triggered flip-flop includes an SR flip-flop. In some embodiments, the SR flip-flop includes a first NOR logic gate and a second NOR logic gate. In some embodiments, the first NOR logic gate has a first output terminal configured to output the first clock output signal and is coupled to the duty cycle calibration circuit, a first input terminal coupled to the multiplexer, and a second input terminal. In some embodiments, the second NOR logic gate has a first output terminal configured to output an inverted first clock output signal and coupled to the second input terminal of the first NOR logic gate, a first input terminal coupled to the adjustable delay circuit, and a second input terminal coupled to the first output terminal of the first NOR logic gate. In some embodiments, the duty cycle calibration circuit includes a programmable duty reference generator circuit, a scrambler circuit, a first filter, a second filter, a comparator and a controller. In some embodiments, the programmable duty reference generator circuit is configured to receive the input duty cycle, and to generate a duty cycle reference signal responsive to the input duty cycle. In some embodiments, the scrambler circuit is coupled to the programmable duty reference generator circuit, and is configured to generate a scrambled duty cycle signal responsive to the duty cycle reference signal. In some embodiments, the first filter is coupled to the scrambler circuit, and is configured to generate a filtered scrambled duty cycle signal responsive to the scrambled duty cycle signal. In some embodiments, the second filter is coupled to the edge triggered flip-flop, and is configured to generate a filtered first clock output signal responsive to the first clock output signal. In some embodiments, the comparator is coupled to the first filter and the second filter, and is configured to generate a comparison signal based on a comparison of the filtered scrambled duty cycle signal and the filtered first clock output signal. In some embodiments, the controller is coupled to the comparator and the delay adjustment circuit, and is configured to generate the set of control signals responsive to the comparison signal. In some embodiments, the first filter includes a first low pass filter including a first resistor and a first capacitor. In some embodiments, the second filter includes a second low pass filter including a second resistor and a second capacitor. In some embodiments, the first resistor has a first resistance equal to a second resistance of the second resistor, and the first capacitor has a first capacitance equal to a second capacitance of the second capacitor.

Yet another aspect of this description relates to a method of operating a clock duty cycle adjustment and calibration circuit. In some embodiments, the method includes generating, by a duty cycle adjustment circuit, a first clock output signal responsive to a first phase clock signal of a first set of phase clock signals and a second phase clock signal of the first set of phase clock signals, the first set of phase clock signals having a first duty cycle, the first clock output signal having a second duty cycle. In some embodiments, the method further includes calibrating, by a duty cycle calibration circuit, the second duty cycle of the first clock output signal based on at least an input duty cycle, the duty cycle calibration circuit being coupled to the duty cycle adjustment circuit. In some embodiments, the method further includes adjusting, by the duty cycle adjustment circuit, the first clock output signal responsive to at least a set of control signals, thereby generating an adjusted first clock output signal having an adjusted second duty cycle. In some embodiments, generating the first clock output signal includes receiving the first phase clock signal of the second set of phase clock signals as a first input to an edge triggered circuit; selecting, by a multiplexer, the second phase clock signal of the second set of phase clock signals as a second input to the edge triggered circuit; and receiving the second phase clock signal of the second set of phase clock signals as the second input to the edge triggered circuit. In some embodiments, the method further includes adjusting, by the duty cycle adjustment circuit, the first clock output signal responsive to at least a set of control signals, thereby generating an adjusted first clock output signal having an adjusted second duty cycle. In some embodiments, adjusting the first clock output signal includes adjusting, by the duty cycle adjustment circuit, the first phase clock signal of the second set of phase clock signals responsive to at least the set of control signals, thereby generating an adjusted first phase clock signal of the second set of phase clock signals; receiving the adjusted first phase clock signal of the second set of phase clock signals as a first input to an edge triggered circuit; selecting, by a multiplexer, the second phase clock signal of the second set of phase clock signals as a second input to the edge triggered circuit; receiving the second phase clock signal of the second set of phase clock signals as the second input to the edge triggered circuit; and generating, by the edge triggered circuit, the adjusted first clock output signal responsive to the adjusted first phase clock signal of the second set of phase clock signals and the second phase clock signal of the second set of phase clock signals. In some embodiments, calibrating the second duty cycle of the first clock output signal based on the input duty cycle includes receiving the input duty cycle from a user; generating, by a programmable duty reference generator circuit, a duty cycle reference signal responsive to the input duty cycle; generating, by a scrambler circuit, a scrambled duty cycle signal responsive to the duty cycle reference signal, the scrambler circuit is coupled to the programmable duty reference generator circuit; generating, by a first filter, a filtered scrambled duty cycle signal responsive to the scrambled duty cycle signal, the first filter is coupled to the scrambler circuit; generating, by a second filter, a filtered first clock output signal responsive to the first clock output signal or the adjusted first clock output signal, the second filter is coupled to an edge triggered circuit; generating, by a comparator, a comparison signal based on a comparison of the filtered scrambled duty cycle signal and the filtered first clock output signal, the comparator is coupled to the first filter and the second filter; and generating, by a controller, the set of control signals responsive to the comparison signal, the controller is coupled to the comparator and a delay adjustment circuit.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock circuit comprising:
    a set of level shifters configured to output a first set of phase clock signals having a first duty cycle, each level shifter of the set of level shifters being configured to output a corresponding phase clock signal of the first set of phase clock signals;
    a duty cycle adjustment circuit configured to generate a first clock output signal responsive to at least one of a first phase clock signal of the first set of phase clock signals, a second phase clock signal of the first set of phase clock signals or a set of control signals, the first clock output signal having a second duty cycle different from the first duty cycle; and
    a calibration circuit coupled to the duty cycle adjustment circuit, and configured to perform a duty cycle calibration of the second duty cycle of the first clock output signal based on an input duty cycle, and to generate the set of control signals responsive to the duty cycle calibration of the second duty cycle.

2. The clock circuit of claim 1, wherein the calibration circuit comprises:
    a programmable duty reference generator circuit configured to generate a duty cycle reference signal responsive to the input duty cycle;
    a scrambler circuit coupled to the programmable duty reference generator circuit, and configured to generate a scrambled duty cycle signal responsive to the duty cycle reference signal;
    a first filter coupled to the scrambler circuit, and configured to generate a filtered scrambled duty cycle signal responsive to the scrambled duty cycle signal;
    a second filter coupled to the duty cycle adjustment circuit, and configured to generate a filtered first clock output signal responsive to the first clock output signal;
    a comparator coupled to the first filter and the second filter, and configured to generate a comparator output signal based on a comparison of the filtered scrambled duty cycle signal and the filtered first clock output signal; and
    a controller coupled between the comparator and the duty cycle adjustment circuit, and configured to generate the set of control signals responsive to the comparator output signal.

3. The clock circuit of claim 2, wherein
    the first filter comprises:
        a first low pass filter including a first resistor and a first capacitor; and
    the second filter comprises:
        a second low pass filter including a second resistor and a second capacitor;
    the first resistor has a first resistance,
    the second resistor has a second resistance equal to the first resistance,
    the first capacitor has a first capacitance, and
    the second capacitor has a second capacitance equal to the first capacitance.

4. The clock circuit of claim 1, further comprising:
    a clock generating circuit coupled to the set of level shifters, the clock generating circuit having a set of stages, and being configured to generate a second set of phase clock signals having the first duty cycle, each stage of the set of stages of the clock generating circuit being configured to output a corresponding phase clock signal of the second set of phase clock signals to a corresponding level shifter of the set of level shifters, wherein each level shifter of the set of level shifters is configured to output the corresponding phase clock signal of the first set of phase clock signals based on the corresponding phase clock signal of the second set of phase clock signals.

5. The clock circuit of claim 4, wherein the clock generating circuit comprises a ring oscillator, the ring oscillator comprising:
    a first set of inverters coupled together in a ring, wherein an output terminal of a first inverter on a first end is coupled to an input terminal of a second inverter on an opposite end from the first end, each inverter of the first set of inverters corresponds to the stage of the set of stages, a number of stages of the set of stages being odd, and a number of inverters in the first set of inverters being odd;
    a second set of inverters, an input of each inverter of the second set of inverters being coupled to a corresponding pair of inverters of the first set of inverters and a corresponding level shifter of the set of level shifters; and a set of buffers, an input of each buffer of the set of buffers being coupled to another corresponding pair of inverters of the first set of inverters and another corresponding level shifter of the set of level shifters.

6. The clock circuit of claim 1, wherein the duty cycle adjustment circuit comprises:

an adjustable delay circuit coupled to a first level shifter of the set of level shifters and an output of the calibration circuit, and configured to output an adjusted first phase clock signal or the first phase clock signal of the first set of phase clock signals responsive to the first phase clock signal of the first set of phase clock signals and the set of control signals.

7. The clock circuit of claim 6, wherein the duty cycle adjustment circuit further comprises:

a multiplexer coupled to at least a sub-set of level shifters of the set of level shifters, the multiplexer being configured to:
 receive a sub-set of phase clock signals of the first set of phase clock signals from a corresponding level shifter of the sub-set of level shifters of the set of level shifters, and a select control signal, and
 output the second phase clock signal of the first set of phase clock signals in response to the select control signal,
the second phase clock signal of the first set of phase clock signals being selected by the multiplexer from the sub-set of phase clock signals of the first set of phase clock signals in response to the select control signal, each phase clock signal of the sub-set of phase clock signals of the first set of phase clock signals having a corresponding phase.

8. The clock circuit of claim 7, wherein the duty cycle adjustment circuit further comprises:

an edge-triggered flip-flop coupled between the multiplexer and the calibration circuit, the edge-triggered flip-flop comprising:
 a first NOR logic gate having a first output terminal configured to output the first clock output signal and being coupled to the calibration circuit, a first input terminal coupled to the multiplexer and being configured to receive the second phase clock signal of the first set of phase clock signals, and a second input terminal; and
 a second NOR logic gate having a first output terminal configured to output an inverted first clock output signal and being coupled to the second input terminal of the first NOR logic gate, a first input terminal coupled to an output of the adjustable delay circuit, and being configured to receive the adjusted first phase clock signal or the first phase clock signal of the first set of phase clock signals, and a second input terminal coupled to the first output terminal of the first NOR logic gate and the calibration circuit, and being configured to receive the first clock output signal.

9. A clock duty cycle adjustment and calibration circuit comprising:

a clock circuit having a set of stages, the clock circuit configured to generate a first set of phase clock signals having a first duty cycle;
a set of level shifters configured to output a second set of phase clock signals, each level shifter of the set of level shifters being coupled to a corresponding stage of the set of stages of the clock circuit, each level shifter of the set of level shifters configured to output a corresponding phase clock signal of the second set of phase clock signals based on a corresponding phase clock signal of the first set of phase clock signals;
a duty cycle adjustment circuit configured to generate a first clock output signal responsive to at least one of a first phase clock signal of the second set of phase clock signals, a second phase clock signal of the second set of phase clock signals or a set of control signals, the first clock output signal having a duty cycle; and
a duty cycle calibration circuit configured to perform a calibration of the duty cycle of the first clock output signal based on an input duty cycle, and to generate the set of control signals responsive to the calibration of the duty cycle of the first clock output signal.

10. The clock duty cycle adjustment and calibration circuit of claim 9, wherein the clock circuit comprises:

a differential ring oscillator having an even number of stages of the set of stages; and
a first set of inverters, each inverter of the first set of inverters being coupled to the corresponding stage of the set of stages of the differential ring oscillator and a corresponding level shifter of the set of level shifters, and a number of inverters in the first set of inverters being even.

11. The clock duty cycle adjustment and calibration circuit of claim 10, wherein the differential ring oscillator comprises:

a second set of inverters in a first path having a first end and a second end opposite from the first end, each inverter of the second set of inverters corresponds to the stage of the set of stages, and a number of inverters in the second set of inverters being even;
a third set of inverters in a second path having a third end and a fourth end opposite from the third end, the second end being coupled to the third end, and the fourth end being coupled to the first end, each inverter of the third set of inverters corresponds to the stage of the set of stages, and a number of inverters in the third set of inverters being even; and
a set of latches, each latch of the set of latches being coupled between the first path and the second path, each latch of the set of latches corresponds to the stage of the set of stages, each latch of the set of latches being coupled to a corresponding pair of inverters of the second set of inverters and a corresponding pair of inverters of the third set of inverters.

12. The clock duty cycle adjustment and calibration circuit of claim 9, wherein the duty cycle adjustment circuit comprises:

a multiplexer coupled to a sub-set of level shifters of the set of level shifters, the multiplexer being configured to receive a sub-set of phase clock signals of the second set of phase clock signals from a corresponding sub-set of level shifters of the set of level shifters, and a select control signal, and being configured to output the second phase clock signal of the second set of phase clock signals in response to the select control signal, the second phase clock signal of the second set of phase clock signals being selected by the multiplexer from the sub-set of phase clock signals of the second set of phase clock signals in response to the select control signal, each phase clock signal of the sub-set of phase clock signals of the second set of phase clock signals having a corresponding phase.

13. The clock duty cycle adjustment and calibration circuit of claim 12, wherein the duty cycle adjustment circuit further comprises:
- an adjustable delay circuit coupled to a first level shifter of the set of level shifters, and configured to output an adjusted first phase clock signal or the first phase clock signal of the second set of phase clock signals responsive to the first phase clock signal of the second set of phase clock signals and the set of control signals; and
- an edge triggered flip-flop coupled between the multiplexer and the adjustable delay circuit, and configured to output the first clock output signal responsive to
  - the adjusted first phase clock signal or the first phase clock signal of the second set of phase clock signals, and
  - the second phase clock signal of the second set of phase clock signals.

14. The clock duty cycle adjustment and calibration circuit of claim 13, wherein the edge triggered flip-flop comprises:
- an SR flip-flop comprising:
  - a first NOR logic gate having a first output terminal configured to output the first clock output signal and being coupled to the duty cycle calibration circuit, a first input terminal coupled to the multiplexer and being configured to receive the second phase clock signal of the second set of phase clock signals, and a second input terminal; and
  - a second NOR logic gate having a first output terminal configured to output an inverted first clock output signal and being coupled to the second input terminal of the first NOR logic gate, a first input terminal coupled to an output of the adjustable delay circuit and being configured to receive the adjusted first phase clock signal or the first phase clock signal of the second set of phase clock signals, and a second input terminal coupled to the first output terminal of the first NOR logic gate and the duty cycle calibration circuit, and being configured to receive the first clock output signal.

15. The clock duty cycle adjustment and calibration circuit of claim 14, wherein the duty cycle calibration circuit comprises:
- a programmable duty reference generator circuit configured to generate a duty cycle reference signal responsive to the input duty cycle;
- a scrambler circuit coupled to the programmable duty reference generator circuit, and configured to generate a scrambled duty cycle signal responsive to the duty cycle reference signal;
- a first filter coupled to the scrambler circuit, and configured to generate a filtered scrambled duty cycle signal responsive to the scrambled duty cycle signal;
- a second filter coupled to the first output terminal of the first NOR logic gate, and configured to generate a filtered first clock output signal responsive to the first clock output signal;
- a comparator coupled to the first filter and the second filter, and configured to generate a comparator output signal based on a comparison of the filtered scrambled duty cycle signal and the filtered first clock output signal; and
- a controller coupled between the comparator and the delay adjustment circuit, and configured to generate the set of control signals responsive to the comparator output signal.

16. The clock duty cycle adjustment and calibration circuit of claim 15, wherein at least the first filter or the second filter comprises:
- a low pass filter.

17. A method of operating a clock duty cycle adjustment and calibration circuit, the method comprising:
- generating, by a duty cycle adjustment circuit, a first clock output signal responsive to a first phase clock signal of a first set of phase clock signals and a second phase clock signal of the first set of phase clock signals, the first set of phase clock signals having a first duty cycle, the first clock output signal having a second duty cycle, wherein generating the first clock output signal comprises:
  - selecting, by a multiplexer, the second phase clock signal of the first set of phase clock signals as a first input to an edge triggered circuit;
- calibrating, by a duty cycle calibration circuit, the second duty cycle of the first clock output signal based on at least an input duty cycle, the duty cycle calibration circuit being coupled to the duty cycle adjustment circuit; and
- adjusting, by the duty cycle adjustment circuit, the first clock output signal responsive to at least a set of control signals, thereby generating an adjusted first clock output signal having an adjusted second duty cycle.

18. The method of claim 17, wherein generating the first clock output signal further comprises:
- receiving, by the edge triggered circuit, the first phase clock signal of the first set of phase clock signals as a second input to the edge triggered circuit; and
- receiving, by the edge triggered circuit, the second phase clock signal of the first set of phase clock signals as the first input to the edge triggered circuit.

19. The method of claim 17, wherein calibrating the second duty cycle of the first clock output signal based on at least the input duty cycle comprises:
- receiving the input duty cycle;
- generating, by a programmable duty reference generator circuit, a duty cycle reference signal responsive to the input duty cycle;
- generating, by a scrambler circuit, a scrambled duty cycle signal responsive to the duty cycle reference signal, the scrambler circuit being coupled to the programmable duty reference generator circuit;
- generating, by a first filter, a filtered scrambled duty cycle signal responsive to the scrambled duty cycle signal, the first filter being coupled to the scrambler circuit;
- generating, by a second filter, a filtered first clock output signal responsive to the first clock output signal or the adjusted first clock output signal, the second filter being coupled to an edge triggered circuit;
- generating, by a comparator, a comparator output signal based on a comparison of the filtered scrambled duty cycle signal and the filtered first clock output signal, the comparator being coupled to the first filter and the second filter; and
- generating, by a controller, the set of control signals responsive to the comparator output signal, the controller being coupled to the comparator and a delay adjustment circuit of the duty cycle adjustment circuit.

20. The method of claim 17, wherein adjusting the first clock output signal comprises:
- adjusting, by the duty cycle adjustment circuit, the first phase clock signal of the first set of phase clock signals responsive to at least the set of control signals, thereby generating an adjusted first phase clock signal of the first set of phase clock signals;

receiving, by an edge triggered circuit, the adjusted first phase clock signal of the first set of phase clock signals as a first input to the edge triggered circuit;

selecting, by a multiplexer, the second phase clock signal of the first set of phase clock signals as a second input to the edge triggered circuit;

receiving, by the edge triggered circuit, the second phase clock signal of the first set of phase clock signals as the second input to the edge triggered circuit; and generating, by the edge triggered circuit, the adjusted first clock output signal responsive to the adjusted first phase clock signal of the first set of phase clock signals and the second phase clock signal of the first set of phase clock signals.

* * * * *